United States Patent
Di Vincenzo

(10) Patent No.: US 11,217,292 B2
(45) Date of Patent: *Jan. 4, 2022

(54) TIME-BASED ACCESS OF A MEMORY CELL

(71) Applicant: Micron Technology, Inc., Boise, ID (US)

(72) Inventor: Umberto Di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/945,999

(22) Filed: Aug. 3, 2020

(65) Prior Publication Data

US 2020/0365197 A1 Nov. 19, 2020

Related U.S. Application Data

(60) Continuation of application No. 16/512,982, filed on Jul. 16, 2019, now Pat. No. 10,755,760, which is a
(Continued)

(51) Int. Cl.
*G11C 11/22* (2006.01)
*G11C 11/00* (2006.01)
*G11C 11/56* (2006.01)

(52) U.S. Cl.
CPC ........ *G11C 11/2273* (2013.01); *G11C 11/005* (2013.01); *G11C 11/221* (2013.01);
(Continued)

(58) Field of Classification Search
None
See application file for complete search history.

(56) References Cited

U.S. PATENT DOCUMENTS 4,127,900 A 11/1978 Raffel et al.
4,412,327 A 10/1983 Fox et al.
(Continued)

FOREIGN PATENT DOCUMENTS

CN 101010715 A 8/2007
CN 101022120 A 8/2007
(Continued)

OTHER PUBLICATIONS

Intellectual Property Office, "Office Action," issued in connection with ROC (Taiwan) Patent Application No. 107119909, dated Aug. 27, 2020 (5 pages).
(Continued)

*Primary Examiner* — Tan T. Nguyen
(74) *Attorney, Agent, or Firm* — Holland & Hart LLP

(57) ABSTRACT

Methods, systems, and devices for time-based access of memory cells in a memory array are described herein. During a sense portion of a read operation, a selected memory cell may be charged to a predetermined voltage level. A logic state stored on the selected memory cell may be identified based on a duration between the beginning of the charging and when selected memory cell reaches the predetermined voltage level. In some examples, time-varying signals may be used to indicate the logic state based on the duration of the charging. The duration of the charging may be based on a polarization state of the selected memory cell, a dielectric charge state of the selected state, or both a polarization state and a dielectric charge state of the selected memory cell.

19 Claims, 14 Drawing Sheets

Related U.S. Application Data continuation of application No. 16/032,398, filed on Jul. 11, 2018, now Pat. No. 10,424,360, which is a division of application No. 15/619,158, filed on Jun. 9, 2017, now Pat. No. 10,153,021.

(52) U.S. Cl.
CPC ...... *G11C 11/2259* (2013.01); *G11C 11/2293* (2013.01); *G11C 11/5657* (2013.01); *G11C 11/22* (2013.01)

(56) References Cited

U.S. PATENT DOCUMENTS

| | | |
|---|---|---|
| 5,768,182 A | 6/1998 | Hu et al. |
| 6,188,615 B1 | 2/2001 | Perner et al. |
| 6,236,603 B1 | 5/2001 | Cleveland |
| 6,469,935 B2 | 10/2002 | Hayashi |
| 6,646,904 B2 | 11/2003 | Chow |
| 7,054,197 B2 | 5/2006 | Vimercati |
| 7,304,881 B2 | 12/2007 | Rodriguez et al. |
| 7,321,512 B2 | 1/2008 | Vimercati et al. |
| 7,345,905 B2 | 3/2008 | Pio et al. |
| 7,508,717 B2 | 3/2009 | Gatto |
| 7,554,861 B2 | 6/2009 | Vimercati et al. |
| 7,616,481 B2 | 11/2009 | Mokhlesi et al. |
| 7,986,578 B2 | 7/2011 | Kim et al. |
| 8,559,244 B2 | 10/2013 | Kuramori |
| 9,281,068 B2 | 3/2016 | Kim |
| 9,355,732 B2 | 5/2016 | Lasser |
| 9,613,676 B1 | 4/2017 | Wang et al. |
| 10,020,042 B2 | 7/2018 | Evans, Jr. et al. |
| 10,038,092 B1 | 7/2018 | Chen et al. |
| 10,153,021 B1 | 12/2018 | Di Vincenzo |
| 10,153,022 B1 | 12/2018 | Di Vincenzo |
| 10,424,360 B2 | 9/2019 | Di Vincenzo |
| 10,755,760 B2* | 8/2020 | Di Vincenzo ....... G11C 11/2293 |
| 2003/0076704 A1 | 4/2003 | Ashikaga |
| 2003/0094630 A1 | 5/2003 | Bok et al. |
| 2003/0198077 A1 | 10/2003 | Ueda et al. |
| 2004/0233744 A1 | 11/2004 | Rodriguez et al. |
| 2005/0024913 A1 | 2/2005 | Kang |
| 2005/0219892 A1 | 10/2005 | Lai et al. |
| 2006/0104133 A1 | 5/2006 | Noma |
| 2007/0260817 A1 | 11/2007 | Ha |
| 2008/0084773 A1 | 4/2008 | Madan et al. |
| 2008/0101107 A1 | 5/2008 | Shiga et al. |
| 2008/0175034 A1 | 7/2008 | Hagiwara et al. |
| 2010/0128515 A1 | 5/2010 | Fukushi |
| 2010/0157666 A1 | 6/2010 | Parkinson |
| 2010/0195408 A1 | 8/2010 | Adams et al. |
| 2011/0063892 A1* | 3/2011 | Kajigaya ................. G11C 7/06 365/149 |
| 2011/0267883 A1 | 11/2011 | Lee et al. |
| 2012/0134196 A1 | 5/2012 | Evans et al. |
| 2013/0051114 A1 | 2/2013 | Kim et al. |
| 2013/0163330 A1 | 6/2013 | Sharon |
| 2014/0133212 A1 | 5/2014 | Evans |
| 2014/0233296 A1 | 8/2014 | Noh et al. |
| 2015/0016175 A1 | 1/2015 | Evans et al. |
| 2016/0379703 A1 | 12/2016 | Schwartz et al. |
| 2018/0025766 A1 | 1/2018 | Dietrich et al. |
| 2019/0066754 A1 | 2/2019 | Di Vincenzo |
| 2019/0066755 A1 | 2/2019 | Di Vincenzo |
| 2020/0211623 A1* | 7/2020 | Raad ................... G11C 11/4074 |

FOREIGN PATENT DOCUMENTS

| | | |
|---|---|---|
| CN | 202632781 U | 12/2012 |
| JP | H09102191 A | 4/1997 |
| JP | 2001184857 A | 7/2001 |
| JP | 2014503930 A | 2/2014 |
| JP | 2016115389 A | 6/2016 |
| JP | 2019523516 A | 8/2019 |
| TW | 201903761 A | 1/2019 |
| WO | 2010048653 A2 | 5/2010 |
| WO | 2013145733 A1 | 10/2013 |
| WO | 2016048653 A1 | 3/2016 |
| WO | 2016186898 A1 | 11/2016 |

OTHER PUBLICATIONS

Japanese Patent Office, "Notice of Rejection Ground," issued in connection with Japanese Patent Application No. 2019-566874, dated Oct. 20, 2020 (13 pages).
China National Intellectual Property Administration, "Office Action," issued in connection with Application No. 201880038003.0, dated Aug. 24, 2020 (5 pages).
European Patent Office, "Search Report," issued in connection with European Patent Application No. 18814318.4, dated Dec. 8, 2020 (8 pages).
Korean Intellectual Property Office, "Notice of Reasons for Rejection," issued in connection with Korean Patent Application No. 10-2020-7000311, dated Dec. 4, 2020 (4 pages).
European Patent Office, "Search Report," issued in connection with Application No. 18814421.6, dated Dec. 23, 2020 (8 pages).
Taiwan Intellectual Property Office, "Office Action," issued in connection with ROC (Taiwan) Patent Application No. 108142241, dated Dec. 10, 2020 (3 pages).
IPO, "Office Action," issued in connection with ROC (Taiwan) Patent Application No. 107119909, dated Feb. 14, 2019 (11 pages).
IPO, "Office Action," issued in connection with ROC (Taiwan) Patent Application No. 108128202, dated Mar. 2, 2020 (11 pages with translation).
ISA/KR, International Search Report and Written Opinion of the International Searching Authority, Int'l. Appl. No. PCT/US2018/035085, dated Sep. 27, 2018, Korean Intellectual Property Office, Daejeon, Republic of Korea, 13 pgs.
ISA/KR, International Search Report and Written Opinion of the International Searching Authority, Int'l. Appl. No. PCT/US2018/035089, dated Oct. 30, 2018, Korean Intellectual Property Office, Seo-gu, Daejeon, Republic of Korea, 12 pgs.
Japan Patent Office, "Notice of Rejection Ground," issued in connection with Japanese Patent Application No. 2019-566916, dated Jan. 12, 2021 (8 pages).
Japan Patent Office, "Decision to Grant a Patent," issued in connection with Japanese Patent Application No. 2019-566874, dated Jan. 5, 2021 (2 pages).
Taiwan Intellectual Property Office, "Office Action," issued in connection with ROC (Taiwan) Patent Application No. 109130327, dated Jun. 2, 2021 (7 pages).
Taiwan Intellectual Property Office, "Office Action," issued in connection with ROC (Taiwan) Patent Application No. 108142241, dated Jun. 10, 2021 (5 pages).

* cited by examiner

TIME-BASED ACCESS OF A MEMORY CELL

CROSS REFERENCE

The present Application for patent is a continuation of U.S. patent application Ser. No. 16/512,982 by Di Vincenzo et al., entitled "Time-Based Access of a Memory Cell," filed Jul. 16, 2019, which is a continuation of U.S. patent application Ser. No. 16/032,398 by Di Vincenzo et al., entitled "Time-Based Access of a Memory Cell," filed Jul. 11, 2018, which is a divisional of U.S. patent application Ser. No. 15/619,158 by Di Vincenzo et al., entitled "Time-Based Access of a Memory Cell," filed Jun. 9, 2017, which is related to co-pending U.S. patent application Ser. No. 15/619,163 by Di Vincenzo, entitled "Time-Based Access of a Memory Cell," filed Jun. 9, 2017, assigned to the assignee hereof, and each of which is expressly incorporated by reference herein.

BACKGROUND

The following relates generally to time-based access of a memory cell and more specifically to time-based sensing of a logic state of the memory cell.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics. It may also be beneficial to employ memory cells capable of storing more than two logic states.

DETAILED DESCRIPTION

Methods, systems, and devices for time-based or time-resolved access of memory cells in a memory array are described herein. This may allow a cell to store more than two logic states and thus more than two bits. The described techniques may also provide other benefits as described herein.

By way of example, memory devices generally use voltages to distinguish between logic states stored on memory cells. For example, during a read operation of a memory cell, a memory controller may cause the memory cell to discharge a charge or a voltage onto an access line. The memory controller may identify the logic state stored on the memory cell based on a comparison between the voltage of the access line and a reference voltage. In some examples, using voltage levels to distinguish between logic states of memory cells may limit how many unique logic states may be stored on a memory cell.

During a sense portion of a read operation, a selected memory cell may be charged to a predetermined voltage level. A logic state stored on the selected memory cell may be identified based on a duration between the beginning of the charging and when selected memory cell reaches the predetermined voltage level. In some examples, time-varying signals may be used to indicate the logic state based on the duration of the charging. In some examples, the duration of the charging may be based on a polarization state of the selected memory cell, a dielectric charge state of the selected state, or both a polarization state and a dielectric charge state of the selected memory cell.

A number of advantages may be realized using time-based sensing techniques during a read operation. In some examples, logic states may be distinguishable using time-based techniques that are not distinguishable using voltage-based techniques. In some examples, a pre-existing memory cell may be configured to store more logic states than is possible using voltage-based sensing techniques. Additional advantages of the techniques, systems, and devices described herein may be apparent based on the features described below.

Features of the disclosure introduced above are further described below in the context of FIGS. 1-12. These and other features of the disclosure are further illustrated by and described with reference to apparatus diagrams, system diagrams, and flowcharts that relate to time-based access of a memory cell.

Figure 1:
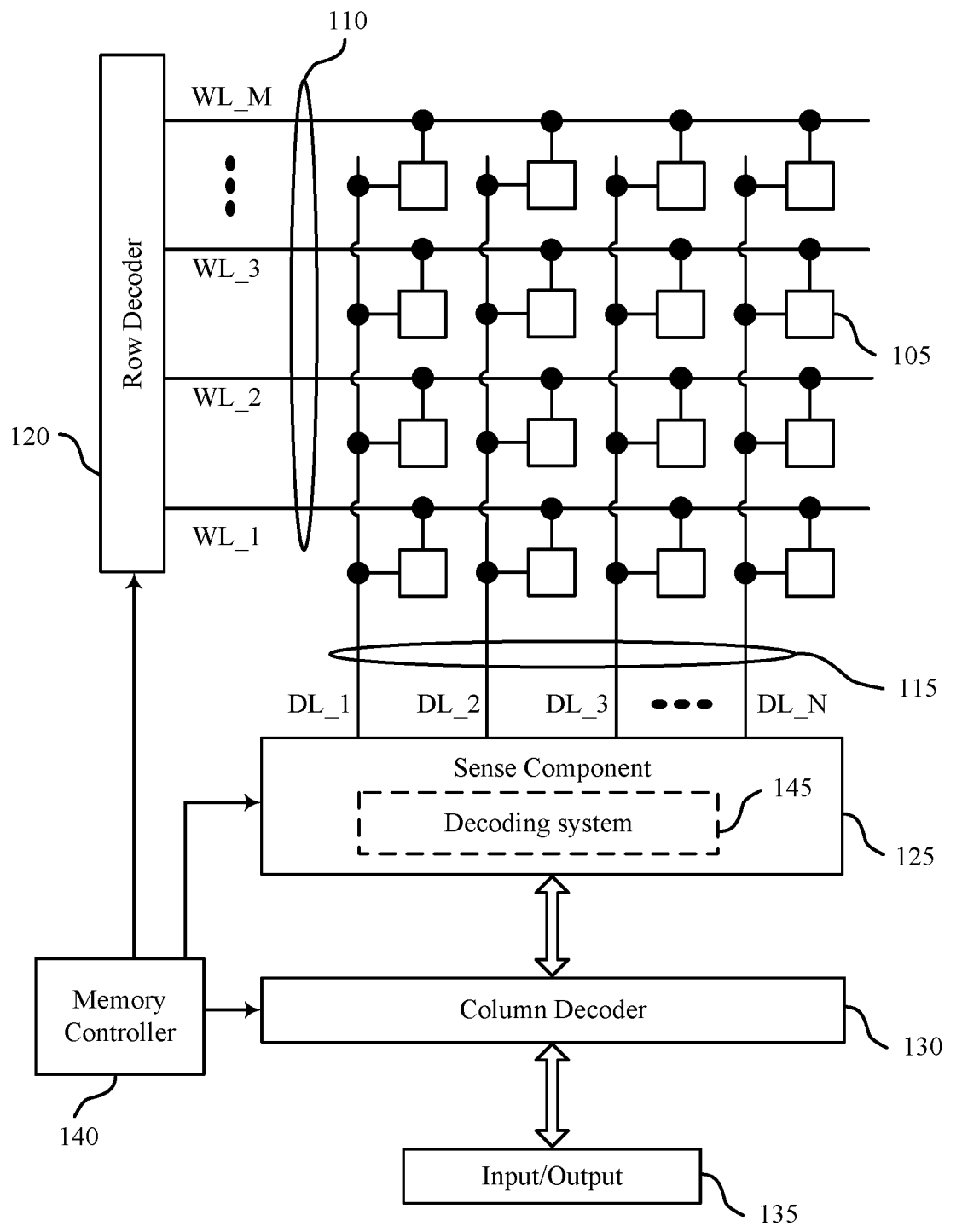
FIG. 1 illustrates an example of a memory array that supports time-based access of a memory cell in accordance with embodiments of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may store a charge representative of the programmable states in a capacitor; for example, a charged and uncharged capacitor may represent two logic states, respectively. DRAM architectures may commonly use such a design, and the capacitor employed may include a dielectric material with linear or para-electric electric polarization properties as the insulator. By contrast, a ferroelectric memory cell may include a capacitor with a ferroelectric as the insulating material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting access line 110 and digit line 115. Access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like. In some examples, other lines (e.g., plates lines—not shown in FIG. 1) also may be present.

According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell. In some instances, the read operation of a memory cell 105 may be time-based. Meaning, for example, that the logic state of the memory cell 105 may be determined based on a duration to satisfy a condition rather than a voltage level satisfying a condition or a threshold. For example, the memory controller 140 may determine the logic state of a memory cell 105 based on a duration it takes for the digit line to be charged to a predetermined voltage. In some examples, the memory cells 105 may be configured as a volatile memory cell, a non-volatile memory cell, or a partly volatile and partly non-volatile memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may result from biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa. Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. In some instances, the sense component 125 may be configured to activate a latch based on the duration for the digit line to be charged to the predetermined voltage. The logic state of the associated memory cell may be determined based on a value of a time-varying signal at the time the latch is activated. In some examples, the sense component 125 may include a decoder system 145. During an access operation (e.g., a read operation or a write operation), a plurality of digit lines 115 may be selected. The decoder system 145 may be configured to coordinate an access operation when multiple digit lines 115 are selected as part of the access operation. In some instances, a pre-decoding system (not shown) may be positioned between the digit lines 115 and the sense component 125 to perform similar functions as the decoder system 145.

A memory cell 105 may be set, or written, by similarly activating the relevant word line 110 and digit line 115—i.e., a logic value may be stored in the memory cell 105. Column decoder 130 or row decoder 120 may accept data, for example input/output 135, to be written to the memory cells 105. A ferroelectric memory cell 105 may be written by applying a voltage across the ferroelectric capacitor. This process is discussed in more detail below. In some instances, the memory cell 105 may be configured to store more than two logic states. For example, a ferroelectric memory cell may be configured to store at least three states by storing both a polarization state and a dielectric charge state. Using both of those states at least one of three logic states of the ferroelectric memory cell may be determined. In some cases, the polarization state and the dielectric charge state of the ferroelectric memory cell may be used to identify four or more logic states that may be stored on the memory cell. For example, the ferroelectric memory cell may be configured to store a plurality of polarization states and a plurality dielectric charge states. Various combinations of the polarization states and the dielectric charge states may define a plurality of logic states of the ferroelectric memory cell. In other examples, a dielectric memory cell may be configured to store a plurality of different dielectric charge states and thereby define more than two logic states. In other examples, a ferroelectric memory cell may be configured to store a plurality of different polarization states and thereby define more than two logic states.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written. In some instances, a ferroelectric memory cell may be configured to store both polarization states and dielectric charge states. As such, access operations, such as write operations, may be modified to store both a polarization state and a dielectric charge state on the ferroelectric memory cell.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, discharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state. As is discussed in more detail below, access operations (e.g., read operation or write operation) performed by the memory controller 140 may be modified to account for time-based sensing and/or multiple logic states being stored on a memory cell 105.

Figure 2:
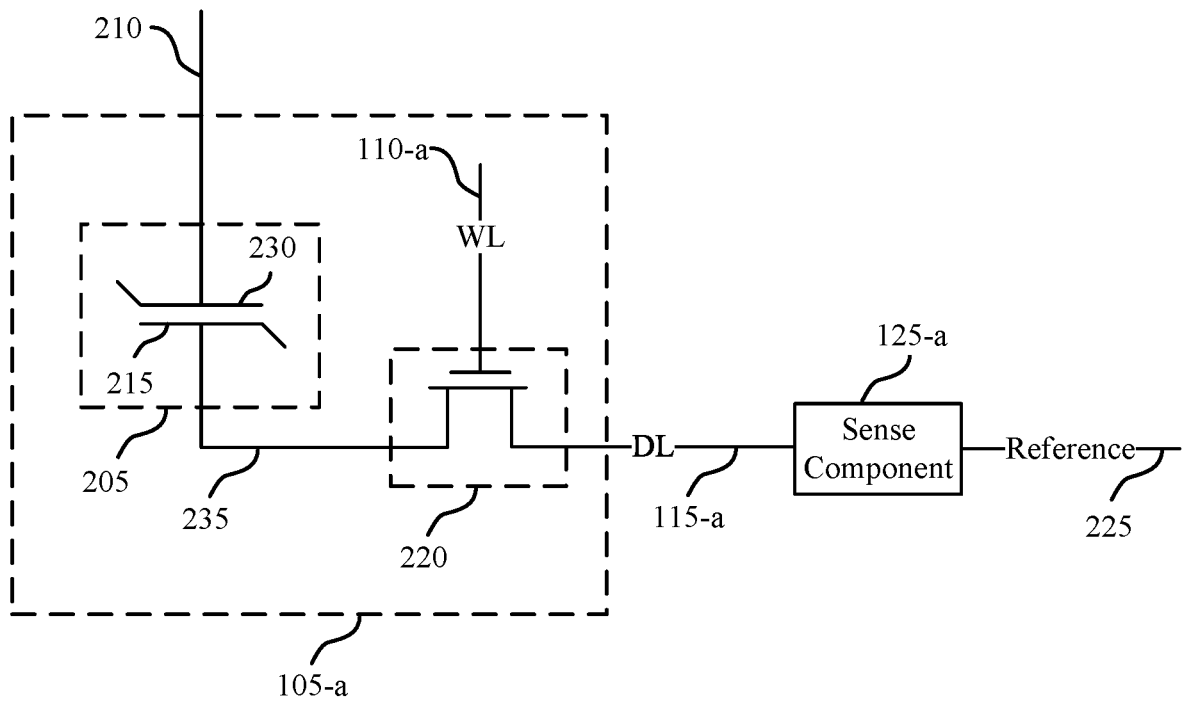
FIG. 2 illustrates an example of a circuit that supports time-based access of a memory cell in accordance with embodiments of the present disclosure.

FIG. 2 illustrates an example circuit 200 in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205. In some cases, the cell bottom 215 (or the cell plate 230 as the case may be) may cooperate with the selection component 220 to form a middle electrode 235. In some instances, the middle electrode 235 may store a charge. In some examples, the charge stored on the middle electrode 235 may contribute, at least in part, to the dielectric charge state of the memory cell 105-a.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a. As discussed in more detail below, the logic state of a memory cell 105-a may be determined based on a duration of time to charge the memory cell 105. Such a time-resolved sensing may enable the memory cell 105 to store additional logic states as compared to voltage-resolved sensing.

In other examples, the positions of selection component 220 and capacitor 205 may be switched, such that selection component 220 is connected between plate line 210 and cell plate 230 and such that capacitor 205 is between digit line 115-*a* and the other terminal of selection component 220. In this embodiment, selection component 220 may remain in electronic communication with digit line 115-*a* through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-*a*. In one scheme, to sense the logic state stored by ferroelectric capacitor 205, word line 110-*a* may be biased to select memory cell 105-*a* and a voltage may be applied to plate line 210. In some cases, digit line 115-*a* is virtually grounded and then isolated from the virtual ground, which may be referred to as "floating," prior to biasing plate line 210 and word line 110-*a*. Biasing plate line 210 may result in a voltage difference (e.g., plate line 210 voltage minus digit line 115-*a* voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-*a* based on the charge stored on capacitor 205. Operation of memory cell 105-*a* by varying the voltage to cell plate 230 may be referred to as "moving cell plate." In some instances, the digit line 115-*a* may be charged to a predetermined voltage level during a read operation. A duration to perform such charging may be based on the logic state stored on the memory cell 105-*a*.

The change in voltage of digit line 115-*a* may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 225) by sense component 125-*a* in order to determine the stored logic state in memory cell 105-*a*. Other sensing processes may be used. In some examples, determination of the stored logic state may be based, at least in part, on a duration of time to charge the digit line to a voltage level.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 225, which may be a reference voltage. The sense amplifier output may be driven to the higher (e.g., a positive) or lower (e.g., negative or ground) supply voltage based on the comparison. For instance, if digit line 115-*a* has a higher voltage than reference line 225, then the sense amplifier output may be driven to a positive supply voltage. In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic 1. Alternatively, if digit line 115-*a* has a lower voltage than reference line 225, the sense amplifier output may be driven to a negative or ground voltage. Sense component 125-*a* may similarly latch the sense amplifier output to determine the stored state in memory cell 105-*a*, e.g., logic 0. In some examples, determination of the state stored in the memory cell may depend, at least in part, on a duration of time to charge to a voltage level. The latched logic state of memory cell 105-*a* may then be output, for example, through column decoder 130 as output 135 with reference to FIG. 1. In some instances, the sense component 125-*a* may be configured to determine when the digit line 115-*a* is charged to a predetermined voltage level. In some examples, the sense component 125-*a* may activate a latch based on determining that the digit line has been charged to the predetermined voltage level. A logic state of the memory cell 105-*a* may be based on a value of a time-varying signal of the latch at the time the latch is activated.

To write memory cell 105-*a*, a voltage may be applied across capacitor 205. Various methods may be used. In one example, selection component 220 may be activated through word line 110-*a* in order to electrically connect capacitor 205 to digit line 115-*a*. A voltage may be applied across capacitor 205 by controlling the voltage of cell plate 230 (through plate line 210) and cell bottom 215 (through digit line 115-*a*). To write a logic 0, cell plate 230 may be taken high, that is, a positive voltage may be applied to plate line 210, and cell bottom 215 may be taken low, e.g., virtually grounding or applying a negative voltage to digit line 115-*a*. The opposite process is performed to write a logic 1, where cell plate 230 is taken low and cell bottom 215 is taken high. In some examples, the write procedure may be modified to account for multiple bits being stored in a single memory cell.

Figure 3:
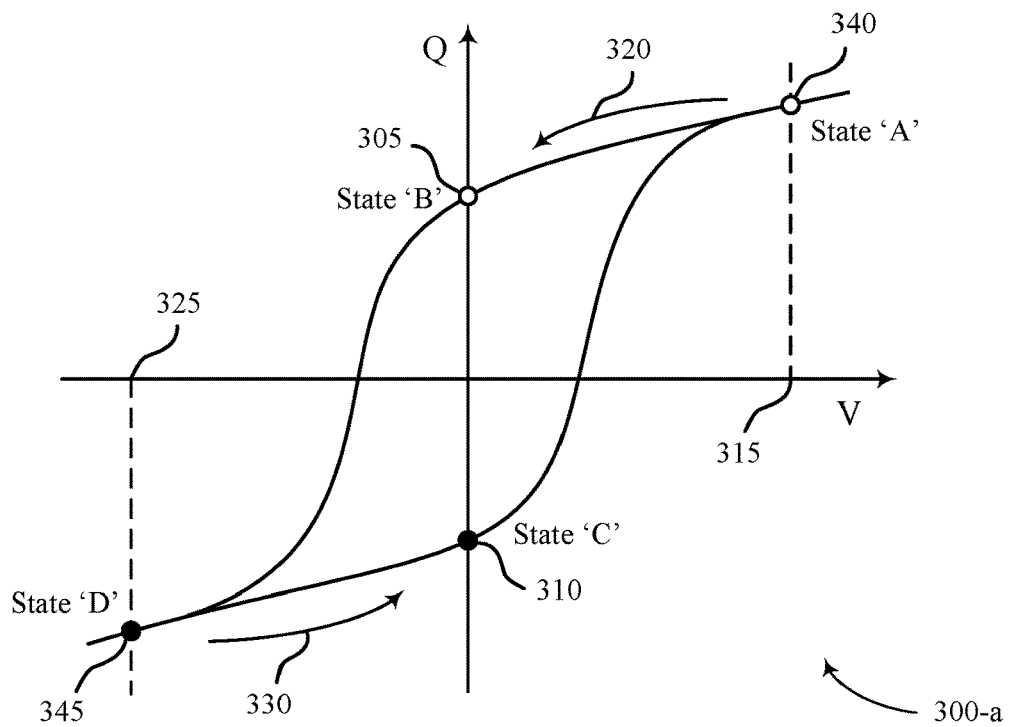
FIG. 3 illustrates an example of hysteresis curves that support time-based access of a memory cell in accordance with embodiments of the present disclosure.
Figure 3:
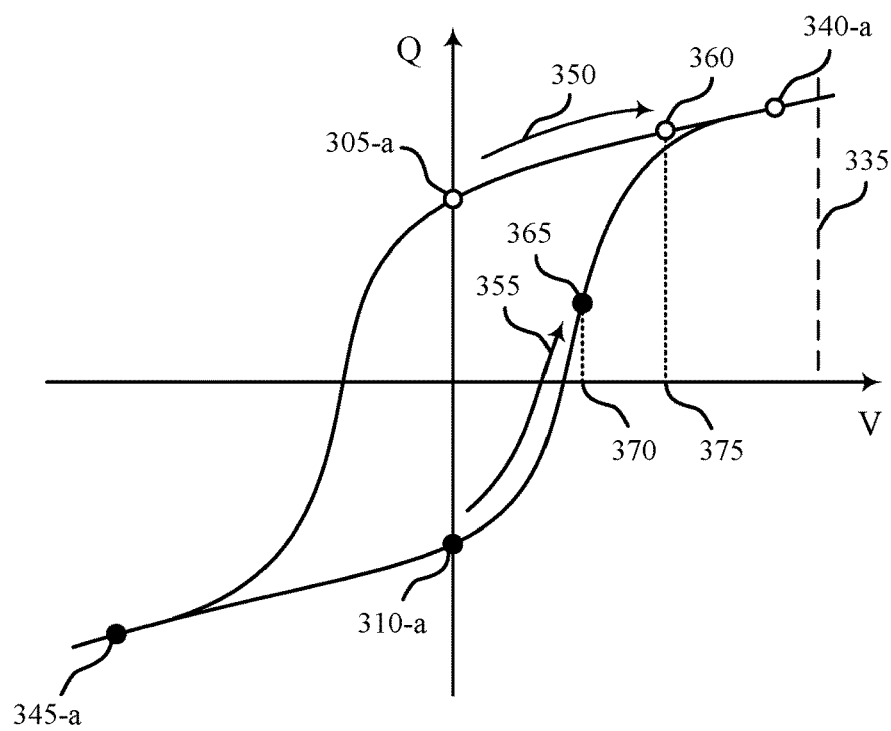

FIG. 3 illustrates an example of non-linear electrical properties with hysteresis curves 300-*a* and 300-*b* for a ferroelectric memory cell that is operated in accordance with various embodiments of the present disclosure. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-*a* and 300-*b* represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a positive or negative polarization with a zero voltage difference, resulting, in some cases, in two possible memory states: memory state 305 (State B) and memory state 310 (State C). According to the example of FIG. 3, memory state 305 (State B) represents a logic 0 and memory state 310 (State C) represents a logic 1. In some examples, the logic values of the respective memory states may be reversed to accommodate other schemes for operating a memory cell.

A logic 0 or 1 may be written to the memory cell by controlling the electric polarization of the ferroelectric material by applying voltage. For example, applying a net positive biasing voltage 315 across the capacitor results in charge accumulation until a memory state 340 (State A) is reached. Upon removing the biasing voltage 315, the memory state 340 (State A) follows path 320 until it reaches the memory state 305 (State B) at zero voltage. Similarly, memory state 310 (State C) is written by applying a net negative biasing voltage 325, which results in a memory state 345 (State D). After removing negative voltage 325, memory state 345 (State D) follows path 330 until it reaches memory state 310 (State C) at zero voltage. Memory states 340 (State A) and 345 (State D) may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether memory state 305-*a* or 310-*a* was initially stored. For example, hysteresis curve 300-*b* illustrates two possible stored memory states 305-*a* and 310-*a*. Biasing voltage 335 may be applied across the capacitor as discussed with reference to FIG. 2. In other cases, a fixed voltage may be applied to the cell plate and, although depicted as a positive voltage, the biasing voltage 335 may be negative. In response to the biasing voltage 335, the memory state 305-*a* may follow path 350. Likewise, if memory state 310-*a* was initially stored, then it follows path 355. The final position of memory state 360 and memory state 365 depend on a number of factors, including the specific sensing scheme and circuitry.

In some cases, the final memory state may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final memory states 360 and 365 on hysteresis curve 300-*b* may thus depend on the capacitance of the digit line and may be determined through a load-line analysis—i.e., memory states 360 and 365 may be defined with respect to the digit line capacitance. As a result, the voltage of the capacitor, voltage 370 or voltage 375, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 370 or voltage 375—i.e., (voltage 335—voltage 370) or (voltage 335—voltage 375). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335—voltage 370) and (voltage 335—voltage 375). Upon comparison by the sense component, the sensed digit line voltage may be determined to be higher or lower than the reference voltage, and the stored logic value of the ferroelectric memory cell (i.e., a logic 0 or 1) may be determined. In some examples, the access procedures (e.g., read or write) of the memory cell may be modified to account for multiple bits being stored in a single memory cell.

As discussed above, reading a memory cell that does not use a ferroelectric capacitor may degrade or destroy the stored logic state. A ferroelectric memory cell, however, may maintain the initial logic state after a read operation. For example, if memory state 305-*a* is stored, the memory state may follow path 350 to memory state 360 during a read operation and, after removing voltage 335, the charge state may return to initial memory state 305-*a* by following path 350 in the opposite direction.

In some instances, a ferroelectric memory cell may be configured to maintain more than two memory states. In some examples, to maintain more than two memory states, the ferroelectric memory cell may be configured to store a polarization state (e.g., a stable state) and a dielectric charge state (e.g., a volatile state). The polarization state may be associated with properties of the ferroelectric material (i.e., polarization of the cell) and the dielectric charge state may be associated with voltage or charge stored on the capacitor. The plurality of logic states of the memory cell may include a plurality of stable states, a plurality of volatile states, or combinations thereof.

For example, a ferroelectric memory cell may be configured to store four memory states: memory state 305 (State B), memory state 310 (State C), memory state 340 (State A), and memory state 345 (State D). In some examples, a logic value stored in the memory cell may be based on a combination of a polarization state (e.g., stable state) and a dielectric charge (e.g., volatile state). In some examples, the number of logic values that may be stored in a memory cell is based on a number of possible combinations of polarization states and dielectric charge states. The memory state 305 (State B) may be based on the memory cell having a positive polarization state and zero-value for the dielectric charge state. The memory state 310 (State C) may be based on the memory cell having a negative polarization state and zero-value for the dielectric charge state. The memory state 340 (State A) may be based on the memory cell having a positive polarization state and positive non-zero voltage or charge for the dielectric charge state. The memory state 345 (State D) may be based on the memory cell having a negative polarization state and negative non-zero voltage or charge for the dielectric charge state.

To store both a polarization state and a dielectric charge state on a memory cell, various operations of a memory array may be altered. For example, during a write operation a memory controller may not discharge the middle electrode of the memory cell. In such examples, the memory cell may maintain a non-zero dielectric charge state.

When a memory cell includes two memory states a single bit of logic may be stored by the memory cell. However, when a memory cell include more than two memory states, additional bits of logic may be stored by the memory cell. For example, if the memory cell includes four memory states, two bits of logic may be stored on memory cell. It should be appreciated that additional memory states may be stored on the memory cell based on different combinations of polarization state values and dielectric charge state values (e.g., memory state 360 and memory state 365).

Figure 4:
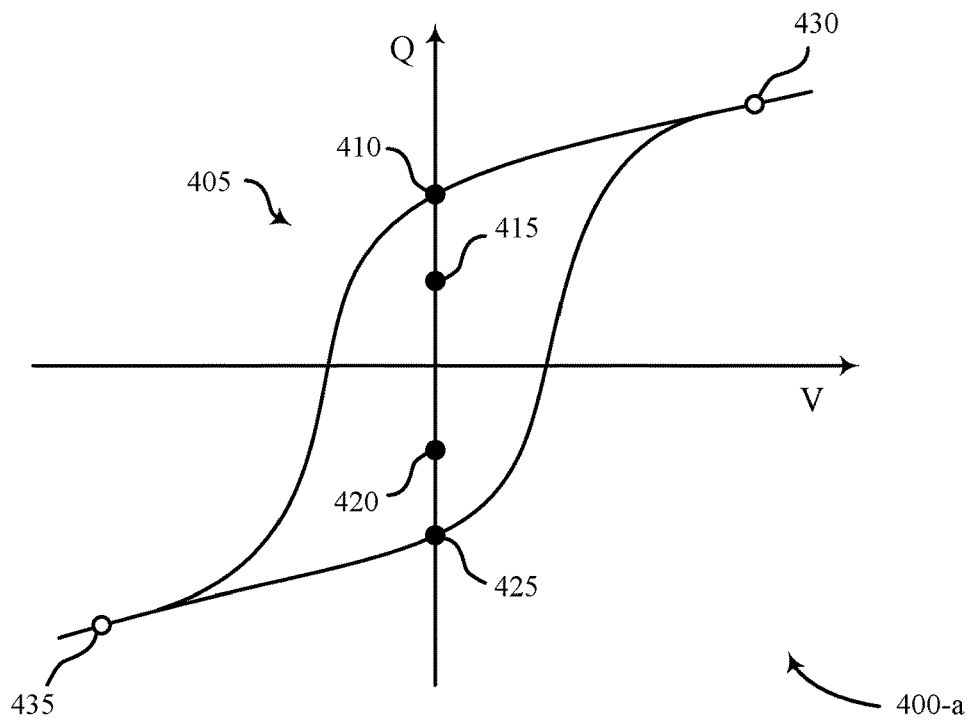
FIG. 4 illustrates an example of state diagrams that support time-based access of a memory cell in accordance with embodiments of the present disclosure.
Figure 4:
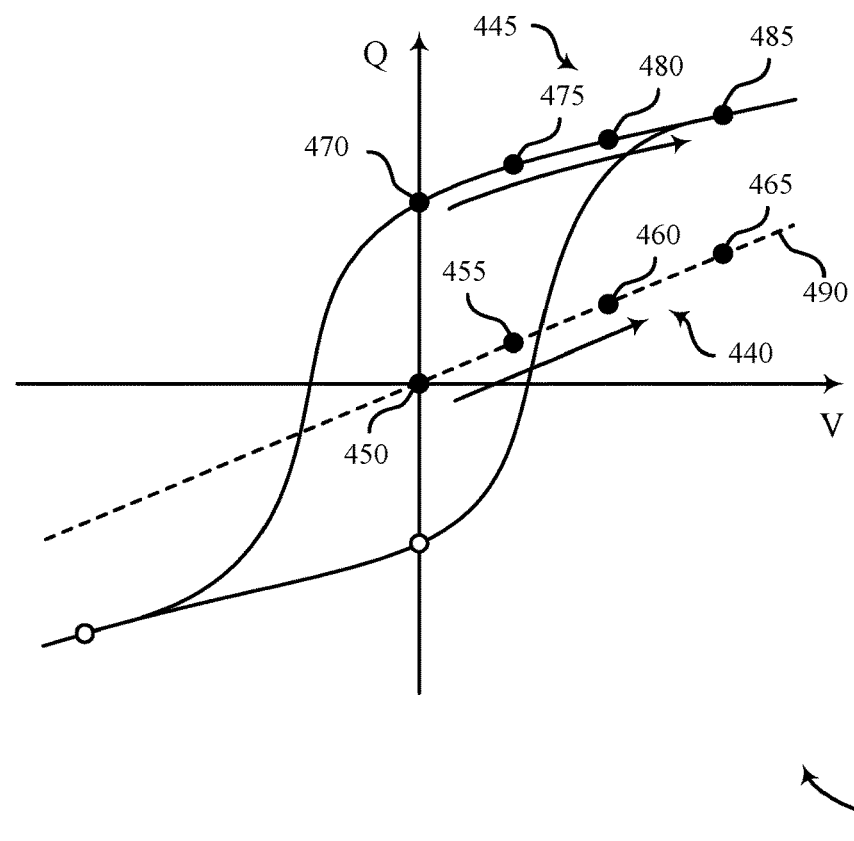

FIG. 4 illustrates an example of state diagrams 400 that support time-based access of a memory cell in accordance with various embodiments of the present disclosure. Time-based sensing may be used to identify a plurality of different types of memory states of a memory cell. For example, as shown in state diagram 400-a, a memory cell may include more than two memory states that are based on polarization. In another example, as shown in the state diagram 400-b, a memory cell may include more than two memory states based on dielectric charges and, in some examples, memory states may be based on both polarization and dielectric charges.

State diagram 400-a illustrates memory states for a memory cell that includes a plurality of polarization memory states 405. The plurality of polarization memory states 405 may include a first memory state 410, a second memory state 415, a third memory state 420, and a fourth memory state 425. While only four memory states are depicted, a memory cell may include any number of memory states including two memory states, three memory states, four memory states, etc. Each of the memory states 410, 415, 420, 425 may be based on a polarization of a ferroelectric memory cell. In some examples, each memory state 410, 415, 420, 425 may include zero dielectric charge. The memory states 410, 415, 420, 425 may be characterized by having a non-zero polarization value and a zero dielectric charge value.

To obtain the memory state 410, a biasing voltage may be applied to the ferroelectric memory cell to move the memory cell to point 430 of the hysteresis curve. After the biasing voltage is released, the ferroelectric memory cell may relax back to a zero dielectric charge state at memory state 410. Similarly, the memory state 425 may be obtained by applying a negative biasing voltage to the ferroelectric memory cell. To obtain the memory states 415, 420, the biasing voltages and/or the timings of a write operation may be altered. For example, the memory cell may be biased to a point different from the point 435 on the hysteresis curve, and/or a sequence of negative and positive voltages may be applied. In some examples, the absolute value of the positive and negative voltage may decrease during the sequence of programming pulses. As discussed in more detail with regard to FIG. 5, time-based sensing techniques may be configured to distinguish between the memory states 410, 415, 420, 425.

State diagram 400-b illustrates memory states for a memory cell that include a plurality of dielectric charge memory states 440 and a plurality of combination polarization and dielectric charge memory states 445. The dielectric charge memory states 440 may include a first memory state 450, a second memory state 455, a third memory state 460, and a fourth memory state 465. While only four memory states are depicted, a memory cell may include any number of memory states including two memory states, three memory states, four memory states, etc. Each of the memory states may be based on a dielectric charge of the memory cell. In such examples, memory states with non-zero dielectric charge may have a corresponding voltage stored on the capacitor. In some cases, a linear relationship (Q=CV) may exist between charge and voltage. Line 490 represents an example of the linear relationship for dielectric charge states. In some examples, the dielectric charge is stored on a capacitor of the memory cell. In some examples, the dielectric charge is stored on a middle electrode memory cell. In some examples, the dielectric charge is stored on both the capacitor and a middle electrode of a memory cell. Each of the memory states 450, 455, 460, 465 may be based on a dielectric charge of a memory cell. In some examples, dielectric charge states may be associated with negative voltage and/or negative charge. In some examples, each memory state 450, 455, 460, 465 may not be polarized. As such, either a dielectric capacitor (e.g., DRAM) or a ferroelectric capacitor may be configured to store the memory states 450, 455, 460, 465. In some examples, a ferroelectric memory cell may be used as a pure DRAM memory cell. In the example depicted in state diagram 440-b, the ferroelectric memory cell may differ from a pure DRAM cell in that a non-zero polarization state is present; however, this difference may be neglected in some examples of multi-level (volatile) storage operations of the memory cell.

To obtain one of the memory states 450, 455, 460, 465, voltage associated with the particular memory state may be applied to a capacitor of the memory cell. Different voltages may be used to obtain different memory states. In some examples, after applying the voltage associated to a particular memory state, the memory cell may be deselected (e.g., the capacitor may be isolated from the digit line).

The combination memory states 445 may include a first memory state 470, a second memory state 475, a third memory state 480, and a fourth memory state 485. While only four memory states are depicted, a memory cell may include any number of memory states including two memory states, three memory states, four memory states, etc. Each of the memory states may be based on a both a polarization and a dielectric charge of the memory cell. Some memory states either the polarization or the dielectric charge may be a zero value.

To obtain one of the memory states 470, 475, 480, 485, one or more biasing voltages associated with the particular memory state may be applied to a capacitor of the memory cell. Different biasing voltages and different timings may be used to obtain different memory states. In some examples, after applying the voltage associated to a particular combined memory state, the memory cell may be deselected (e.g., the capacitor may be isolated from the digit line), so that the capacitor stores the dielectric charge accumulated onto it.

In some examples, the dielectric charge memory states 440 and the combination memory states 445 may be associated with positive biasing voltages. In such examples, a single current generator may be configured to charge a digit line during a time-based read operation. In some examples, the dielectric charge memory states 440 and the combination memory states 445 may be associated with both negative and positive biasing voltages (e.g., memory states 305, 310,

340, 345). In some of those examples, additional components may be used to execute access operations on a memory cell.

As used herein, a memory state may refer to a state of a memory cell. For example, a memory state may include a polarization and a dielectric charge. As used herein, a logic state may refer to digital logic associated with a memory state of a memory cell. For example, a logic state may include a logic '0,' a logic '1,' a logic '00,' a logic '01,' a logic '10,' a logic '11,' etc. Logic states may be mapped to memory states. In some examples, a one-to-one mapping exists between logic states and memory states. As used herein, the term memory state may be used interchangeably with the term logic state. As such, in some examples, a logic state may include a polarization state or a dielectric charge state or combinations thereof.

Figure 5:
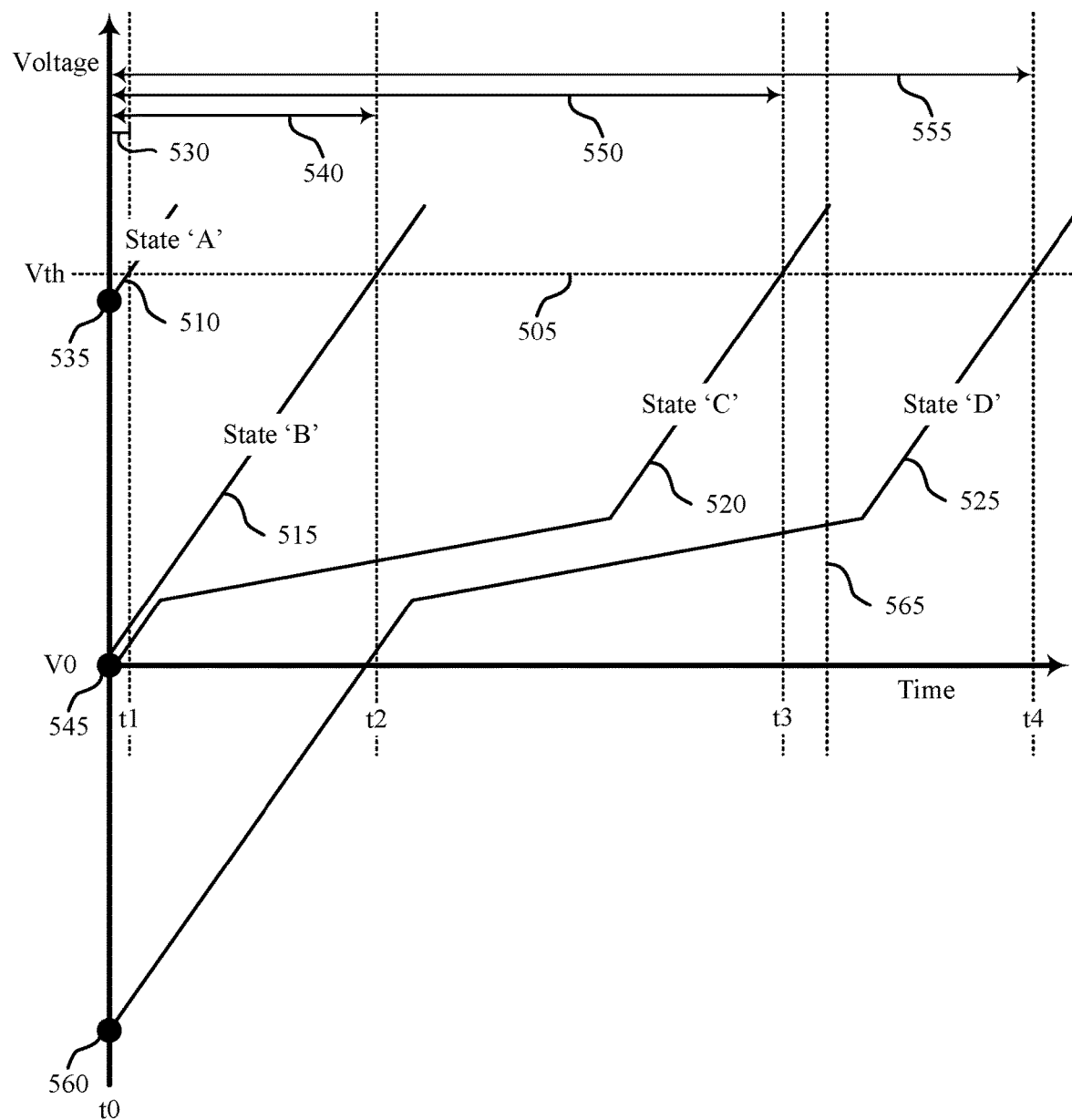
FIG. 5 illustrates an example of a timing diagram that supports time-based access of a memory cell in accordance with embodiments of the present disclosure.

FIG. 5 illustrates an example of a timing diagram 500 that supports time-based access of a memory cell in accordance with various embodiments of the present disclosure. In some instances, a read operation of a memory cell may distinguish between logic states based on time and durations. For example, after biasing a memory cell 105 and/or its associated digit line 115, a sense component may detect different responses based on the memory state of the memory cell. A logic state stored on a memory cell 105 (or a memory state of the memory cell 105) may be determined by detecting the duration between applying the biasing and when a voltage of the memory cell satisfies a voltage threshold 505.

The timing diagram 500 is associated with the memory states depicted and described with relation to hysteresis curve 300-a of FIG. 3. As such, the timing diagram 500 may be associated with memory states of a ferroelectric memory cell. However, it should be appreciated that other timing diagrams are encompassed by this disclosure based on the memory states of the memory cell. For example, different timing diagrams may be associated with dielectric memory cells.

The illustrative timing diagram 500 includes a first response signal 510, a second response signal 515, a third response signal 520, and a fourth response signal 525. Each response signal may be associated with one of the memory states depicted in hysteresis curve 300-a. For example, the first response signal may be associated with a memory cell storing a memory state A (e.g., memory state 340 (State A)). The second response signal 515 may be associated with a memory cell storing a memory state B (e.g., memory state 305 (State B)). The third response signal 520 may be associated with a memory cell storing a memory state C (e.g., memory state 310 (State C)). The fourth response signal 525 may be associated with a memory cell storing a memory state D (e.g., memory state 345 (State D)).

During a read operation, a power source (e.g., a current generator) may charge the memory cell 105 to a predetermined voltage level. Based on the amount of time taken from the memory cell to reach a voltage threshold 505 associated with the predetermined voltage level, a memory controller 140 may be configured to determine what memory state is stored on the memory cell 105. In some examples, the predetermined voltage level may be the biasing voltage used to obtain the states (e.g., voltage 315). In some examples, the predetermined voltage level may be the dielectric charge voltage associated with the memory state A.

The duration needed to satisfy the voltage threshold 505 during a read operation may be based on the memory state of the memory cell. At time t0, a voltage or a current may be applied to the memory cell to charge the memory cell to the predetermined voltage level. At time t1, the first response signal 510 associated with the memory state A of a memory cell satisfies the voltage threshold 505. A duration 530 defined between time t0 and time t1 may be the duration used to determine whether the memory cell 105 is in the memory state A. In some examples, the memory state A starts at a positive voltage 535 because of the dielectric charge of the memory cell in the memory state A. In some examples, the predetermined voltage level to which the memory cell is charged is based on the positive voltage 535 associated with the memory state A. In some examples, the voltage threshold 505 is based on the positive voltage 535 associated with the memory state A. In such examples, the duration 530 may be quite small due to this relationship. In some examples, the duration 530 may be zero because the voltage threshold 505 is set to be less than the positive voltage 535.

When the memory cell is charged to the predetermined positive voltage level, the memory state A of the memory cell may advance along a hysteresis curve following path 350, as shown in hysteresis curve 300-b. Because the memory state A is positioned so close to the predetermined positive voltage level, the duration 530 may be small. In some examples, the duration 530 may be about zero nanoseconds.

At time t2, the second response signal 515 associated with the memory state B of the memory cell 105 may satisfy the voltage threshold 505. A duration 540 defined between time t0 and time t2 may be the duration used to determine whether the memory cell 105 is in the memory state B. In some examples, the memory state B starts at a zero voltage 545 because the memory cell storing the memory state B does not include any dielectric charge.

When the memory cell is charged to the predetermined positive voltage level, the memory state B of the memory cell may advance along a hysteresis curve following path 350, as shown in hysteresis curve 300-b. The duration 540 may be based at least in part on a length of the hysteresis curve the memory state B may travel before reaching the predetermined positive voltage level. In some examples, the duration 540 may be based at least in part on a constant current level used to charge the memory cell.

At time t3, the third response signal 520 associated with the memory state C of the memory cell 105 may satisfy the voltage threshold 505. A duration 550 defined between time t0 and time t3 may be the duration used to determine whether the memory cell 105 is in the memory state C. In some examples, the memory state C starts at the zero voltage 545 because the memory cell storing the memory state C does not include any dielectric charge.

When the memory cell is charged to the predetermined positive voltage level, the memory state C of the memory cell may advance along a hysteresis curve following path 355, as shown in hysteresis curve 300-b. The duration 550 may be based at least in part on a length of the hysteresis curve the memory state C may travel before reaching the predetermined positive voltage level. In some examples, the duration 550 may be based at least in part on a constant current level used to charge the memory cell. In some examples, the starting voltages for both the second response signal 515 and the third response signal 520 are the same but the duration 540 is different than the duration 550. Such a phenomenon may be the result of different polarization states. The memory state C may travel a different path along the hysteresis curve to reach the predetermined voltage level, and as such it may take longer for the digit line 115 to satisfy the voltage threshold 505 (e.g., duration 550 may be longer than duration 540). In some examples, if the memory cell is in memory state 310 (State C), some of the charge injected in the memory cell may be used to flip its polarization state and some of the charge may be used to charge the memory cell so that more charge (or time) may be used to satisfy the voltage threshold 505 with respond to a memory cell in memory state 305 (State B).

At time t4, the fourth response signal 525 associated with the memory state D of the memory cell 105 may satisfy the voltage threshold 505. A duration 555 defined between time t0 and time t4 may be the duration used to determine whether the memory cell 105 is in the memory state D. In some examples, the memory state D starts at a negative voltage 560 because the memory cell storing the memory state D does includes a negative dielectric charge.

When the memory cell is charged to the predetermined positive voltage level, the memory state D of the memory cell may advance along a hysteresis curve following path 355, as shown in hysteresis curve 300-b and continue along the hysteresis curve to the predetermined memory state. The duration 555 may be based at least in part on a length of the hysteresis curve the memory state D may travel before reaching the predetermined positive voltage level. In some examples, the duration 555 may be based at least in part on a constant current level used to charge the memory cell.

In some instances, a memory controller 140 may be configured to determine the logic state stored on a memory cell 105 after time t3. For example, if the voltage threshold 505 has not been satisfied by time t3, the memory controller 140 may determine by inference that the memory cell 105 is in a memory state D. To make such inferences, in some examples, a memory controller 140 define a time threshold 565 for a read operation. If the voltage threshold 505 is not satisfied when the time threshold 565 is satisfied, the memory controller 140 may determine (by inference) that the memory cell 105 is in a specific memory state. In the illustrative example of FIG. 5, the time threshold 565 may be set about at time t3 or shortly after time t3 and the time threshold 565 may be used to determine (by inference) that the memory cell 105 is in the memory state D. The use of a time threshold 565 may reduce the amount of total time used to perform a read operation. For example, during a read operation, a memory controller 140 may reduce the amount of time it attempts to detect whether the voltage threshold 505 is satisfied based on the time threshold 565.

In some examples, a response signal (not shown in FIG. 5) may exist for any given memory state (e.g., for any given point in the Q-V diagram representing all possible combinations of polarization states and dielectric charge state of a memory cell). For any given memory state, the response signal may have one or more linear portions associated with dielectric charging (and/or discharging) the memory cell capacitor and one or more other portions (typically with a slower slope) corresponding to a modification of the polarization of the capacitor. The duration of each portion (either dielectric charging or polarization) may be based at least in part on the initial memory state (e.g., on the combination of the polarization and the dielectric charge stored on the capacitor) and/or on the current used to charge the memory cell to the predetermined voltage level.

Figure 6:
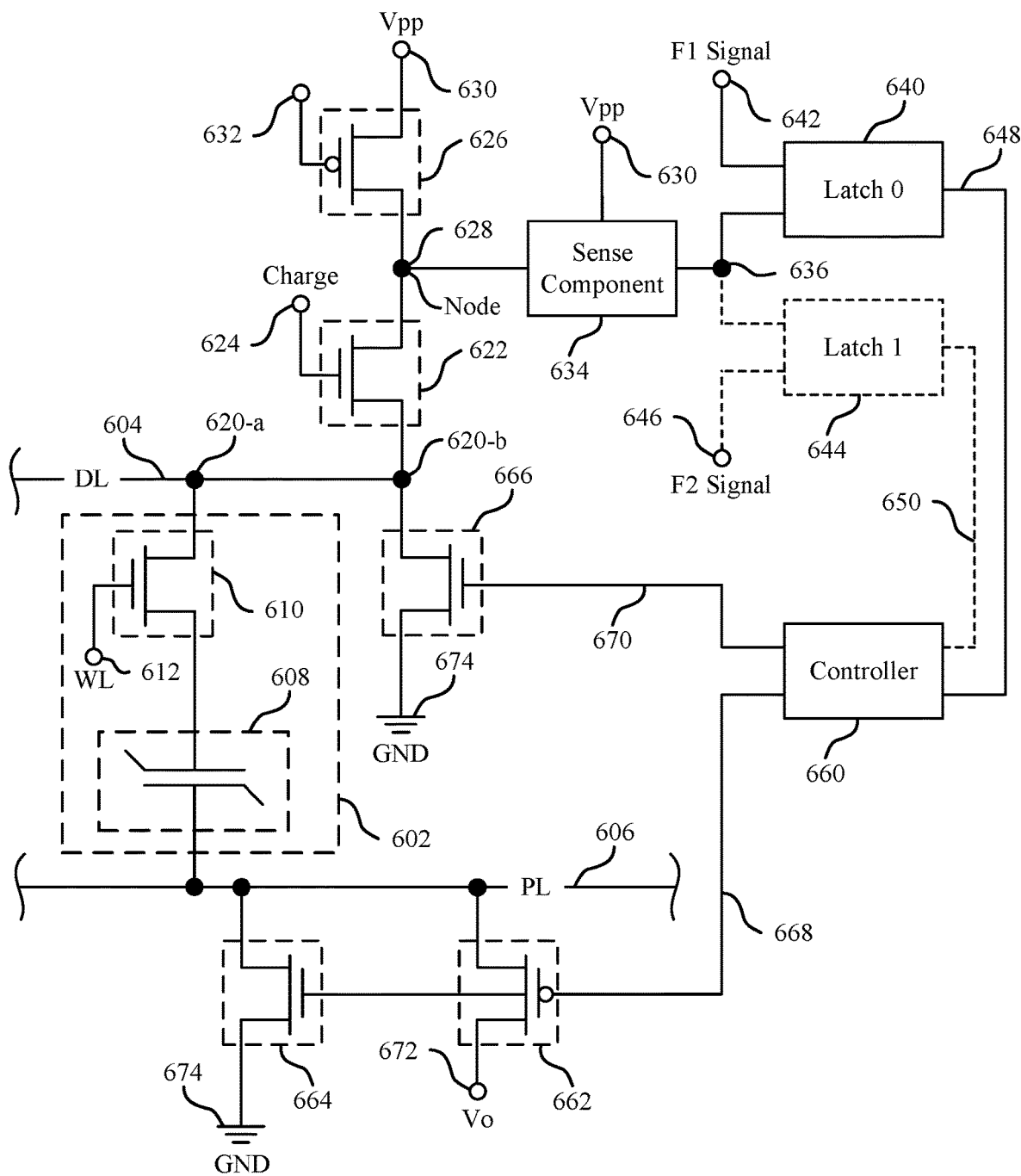
FIG. 6 illustrates an example of a circuit that supports time-based access of a memory cell in accordance with embodiments of the present disclosure.

FIG. 6 illustrates an example of a circuit 600 that supports time-based access of a memory cell in accordance with various embodiments of the present disclosure. The circuit 600 may be configured to perform time-based access operations (e.g., read operations and write operations).

The circuit 600 may include a memory cell 602 coupled to a digit line 604 and a plate line 606. The memory cell 602 may include a capacitor 608 and a selection component 610. In some examples, a middle electrode may be defined between the capacitor 608 and the selection component 610. In some examples, the capacitor 608 may be a ferroelectric capacitor. In some examples, the capacitor 608 may be a dielectric capacitor. The selection component 610 may be coupled to an access line 612 (e.g., word line) configured to activate the selection component 610 based on instructions received from a memory controller. The memory cell 602 may be an example of the memory cells described with reference to FIGS. 1-5. The digit line 604 may be an example of the digit lines 115 described with reference to FIGS. 1-5. The plate line 606 may be an example of the plate lines 210 described with reference to FIG. 2. The capacitor 608 may be an example of the capacitor 205 described with reference to FIG. 2. The selection component 610 may be an example of the selection component 220 described with reference to FIG. 2. The access line 612 may be an example of the word line 110 described with reference to FIGS. 1 and 2.

At a first node 620, the memory cell 602 may couple to the digit line 604. A charging component 622 may be coupled to the digit line 604 at the first node 620. The charging component 622 may be configured to charge the memory cell 602 and/or the digit line 604 to perform a time-based read operation. The charging component 622 may be coupled to a control line 624. The control line 624 may communicate instructions from the memory controller 140 whether to charge the memory cell 602 or not. The charging component 622 may be activated based on the instructions from the memory controller 140. In some examples, the charging component 622 is current generator. In some examples, the charging component 622 is a cascode. In some examples, the charging component 622 may include one or more transistors.

An isolation component 626 may be coupled to the charging component 622 at a second node 628 (Node). The isolation component 626 may be configured to selectively couple the second node 628 to a voltage source 630 (Vpp) based on instructions received from the memory controller 140 by a control line 632. In some examples, the isolation component 626 may be an example of a transistor or other switching component.

A sense component 634 may be coupled to charging component 622. In some examples, the sense component 634 may be coupled to the second node 628. As is more described with reference to FIG. 7, the sense component 634 may be configured to detect when the digit line 604 at the first node 620 charges to a predetermined voltage level. The sense component 634 may be configured to detect when a voltage level at the second node 628 satisfies a threshold voltage. In some examples, the sense component 634 may be coupled to the voltage source 630. In some examples, the sense component 634 may be an inverter. In some examples, the sense component 634 may be components or circuitry configured to compare a voltage level of the second node 628 to a voltage threshold (e.g., voltage threshold 505). The sense component 634 may output a signal to a third node 636 based on the voltage level of the second node satisfying the threshold. In some examples, the sense component 634 may sense a voltage level at the second node 628. In some examples, the sense component 634 may be coupled to the digit line 604 at the first node 620.

A first latch 640 may be coupled to the sense component 634. In some examples, the first latch 640 may be coupled to the third node 636. The first latch 640 may be configured to output the value of the logic state stored on the selected memory cell 602. The first latch 640 may be used as part of a time-based read operation where the value output by the first latch 640 may be based on a duration since the read operation began or since the memory cell 602 began to be charged.

The first latch 640 may be coupled to a first time-varying signal 642 (the "F1 Signal") by an access line. The first time-varying signal 642 may be configured to indicate a logic state of the memory cell 602 based on the duration between beginning to charge the memory cell 602 or the digit line 604 and receiving a signal output from the sense component 634. The signal being output from the sense component 634 may be based on a voltage level satisfying a threshold. The first time-varying signal 642 may be configured to define at least three logic states. In some examples, the first time-varying signal 642 may be configured to define at least two logic states. In some examples, the first time-varying signal 642 may be configured to define at least four logic states, or some cases, more than four logic states.

In some examples, the memory controller 140 may apply the first time-varying signal 642 to the first latch 640 when the memory cell 602 or digit line 604 begins to be charged by the charging component 622. The first time-varying signal 642 may be a predetermined time-varying signal based on the expected logic states of the memory cell 602. The first time-varying signal 642 may vary in a predetermined manner over a predetermined time interval. In some examples, the first time-varying signal 642 may be received from a memory controller 140.

The first time-varying signal 642 may define a mapping between memory states of the memory cell 602 and logic states of the memory cell 602. During a read operation, the charging component 622 may charge the memory cell 602. Based on the memory state of the memory cell 602 (e.g., its polarization and/or dielectric charge), it will take a certain time duration for a voltage associated with the memory cell 602 to satisfy a voltage threshold (e.g., voltage threshold 505). The first time-varying signal 642 may be configured to cycle through the possible logic states of the memory cell 602. If the memory cell 602 is in a first memory state A, the first time-varying signal 642 may be configured to represent a first logic state associated with the first memory state A for a subinterval of time. The subinterval of time being associated with an expected duration for the memory cell 602 to charge when the memory state A. The first time-varying signal 642 may define a logic state for each memory state of the memory cell 602 for a subinterval of the total overall interval. For example, the first time-varying signal 642 may include a first subinterval defining a logic state associated with the memory state A. After the first subinterval, the first time-varying signal 642 may include a second subinterval defining a logic state associated with the memory state B. Such a pattern may continue until the memory states/logic states of the memory cell 602 are represented by the first time-varying signal 642. In some examples, the subintervals are substantially equal in duration. However, in other examples, the subintervals may be different durations based on the expected charging durations of the memory cell 602.

In some examples, a second latch 644 may cooperate with the first latch 640 to define the logic states of the memory cell 602. The second latch 644 may be coupled to the third node 636 and to a second time-varying signal 646 (F2 Signal). The second time-varying signal 646 may cooperate with the first time-varying signal 642 to define the logic states of the memory cell 602. Such an example, is described in more detail with reference to FIG. 8. In some examples, additional latches (not shown in FIG. 6) may be present. The additional latches may cooperate the with the first latch and the second latch to define more logic states of the memory cell by dividing the reading time duration in finer granularity time subintervals.

A controller 660 may be coupled to the first latch 640 by a data line 648 and to the second latch 644 by a data line 650. The controller 660 may be configured to identify the logic state of the memory cell 602 based on the value of the first time-varying signal 642 received from the first latch 640. In some examples, identifying the logic state of the memory cell 602 may be based on both the first time-varying signal 642 and the second time-varying signal 646 received from the second latch 644. The controller 660 may also be configured to execute a write back operation as part of the read operation. In some examples, the controller 660 may be configured to identify a first bit of the logic state prior to identifying a second bit of the logic state. For example, if the memory cell 602 is capable of storing four logic states (00, 01, 10, 11), the controller 660 may be configured to identify whether the most-significant bit of a memory identifier is a logical '1' or a logical '0' prior to identifying the value of the other bit.

The controller 660 may also operate the switching components 662, 664, 666 to perform a write back portion of a read operation. In some examples, the controller 660 may be configured to perform write operations as part a normal write operation. The controller 660 may be coupled to the switching components 662, 664 by a first control line 668. The controller 660 may be coupled to the switching component 666 by a second control line 670. In some examples, any number of control lines may be used by the controller 660 to operate the switching components 662, 664, 666.

The switching component 662 may be coupled to a voltage source 672 (Vo). The switching component 662 may be configured to bias the plate line 606 high (e.g., to the voltage source 672) during a write operation or a write back operation. The switching component 662 may be a transistor or other type of switching component.

The switching component 664 may be coupled to a ground 674. The switching component 664 may be configured to bias the plate line 606 low (e.g., to ground) during a write operation or a write back operation. In some examples, the ground 674 may be a ground or a virtual ground that is a voltage source at a Vss.

In the instances when the same control line is used to control both the switching component 662 and the switching component 664 (e.g., first control line 668), the switching component 662 may be configured to be activated when the switching component 664 is deactivated. As such, the switching component 662 may be configured to be activated based on a low signal, while the switching component 664 may be configured to be activated based on a high signal, or vice versa.

The switching component 666 may be coupled to the ground 674. The switching component 664 may be configured to bias the digit line 604 low (e.g., to ground or virtual ground) during a write operation or a write back operation. In some examples, the controller may be configured the word line 612 during a write or write-back operation. Such control of the word line 612 may be used when the word line 612 is deactivated after the dielectric charging of the memory cell 602.

In some examples, the controller 660 may be coupled to another switching component to bias the digit line 604 high during a write or write back operation. In some examples, the charging component 622 may be operated to bias the digit line 604 high during a write or write back operation.

In some instances, the controller 660 may be an example of the memory controller 140. In some instances, the controller 660 may be a dedicated component, a dedicated circuit, or dedicated logic configured to perform the functions described herein. In some instances, the controller 660 may be coupled to the memory controller 140 and may be configured to cooperate with the memory controller 140 to perform the various functions described herein. For example, the controller 660 may perform some portions of the functions described herein and the memory controller 140 may perform the other portions of the functions described herein, in some examples.

Figure 7:
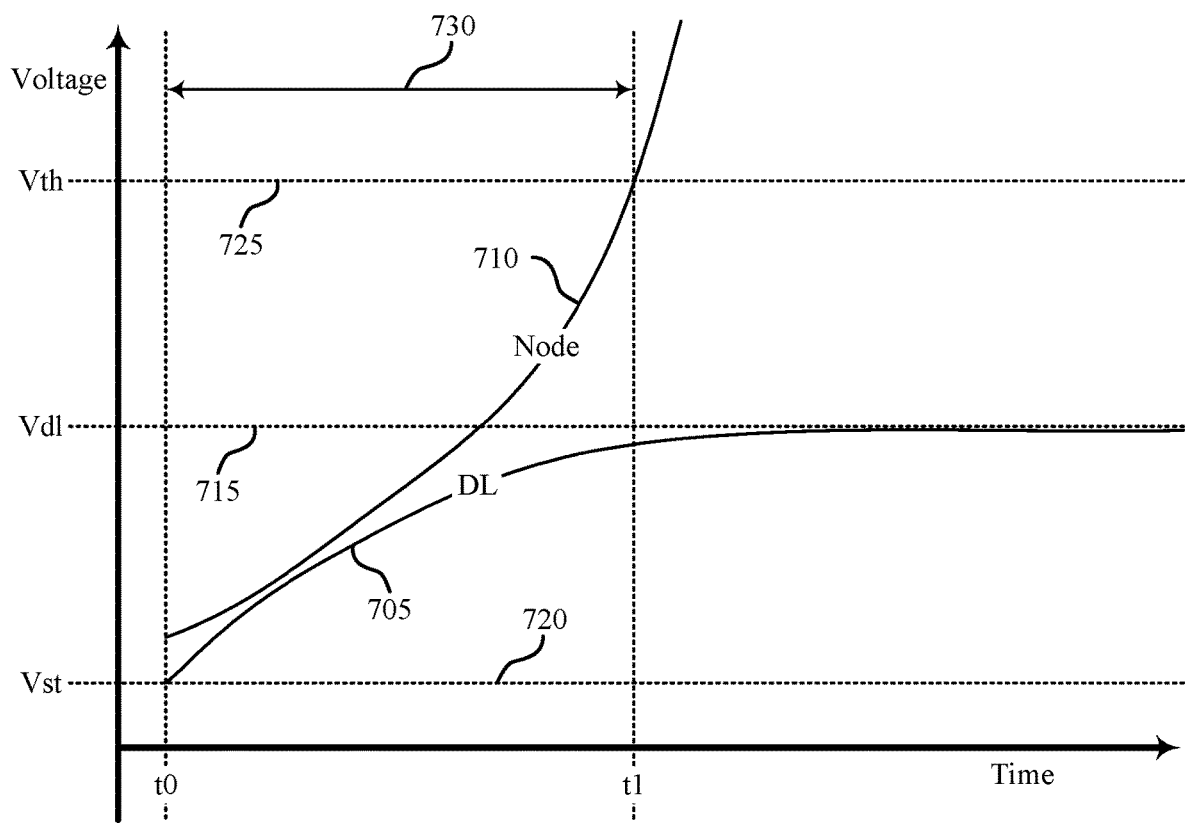
FIG. 7 illustrates an example of a timing diagram that supports time-based access of a memory cell in accordance with embodiments of the present disclosure.

FIG. 7 illustrates an example of a timing diagram 700 that supports time-based access of a memory cell in accordance with various embodiments of the present disclosure. The timing diagram 700 illustrates a digit line voltage signal 705 of the digit line 604 at the first node 620 and a node voltage signal 710 at the second node 628 of the circuit 600. The digit line voltage signal 705 and the node voltage signal 710 may represent voltages during a read operation of a memory cell 602. More specifically, the signals 705, 710 may represent voltages during a sense portion of the read operation.

A read operation performed on the memory cell 602 may include a preconditioning portion, a sense portion, a write back operation, and a precharge portion. At time to, a memory controller 140 may initiate a sense portion of the read operation. To develop the signal from the memory cell 602, the memory controller 140 may activate the charging component 622 to charge the memory cell 602 or the digit line 604 to the predetermined voltage level 715 as represented by Vdl in FIG. 7. The voltage level of the memory cell 602 rises from a starting voltage level 720 (represented by Vst in FIG. 7) to the predetermined voltage level 715 (Vdl).

The voltage level of the second node 628, as represented by the node voltage signal 710, also rises from a starting voltage level based on the memory cell 602 being charged. The starting voltage level of the second node 628 may be based on the starting voltage level of the digit line 604 and/or memory cell 602. In some examples, the starting voltage level of the second node 628 may be the same as the starting voltage level of the digit line 604 and/or memory cell 602. In some examples, the starting voltage level of the second node 628 may be different from the starting voltage level of the digit line 604 and/or memory cell 602. In some examples, the starting voltage varies based on a memory state of the memory cell 602 being charged.

A voltage threshold 725 may be defined for the voltage level of the second node 628 (represented by node voltage signal 710). The voltage threshold 725 may be associated with when the voltage level of the digit line 604 and/or memory cell 602 reaches the predetermined voltage level 715. The voltage threshold 725 may be selected based on an identified relationship between the voltage level of the second node 628 and a voltage level of the first node 620. In some examples, the voltage threshold 725 may be an example of the voltage threshold 505 described with reference to FIG. 5.

At time t1, the voltage level at the second node 628 may satisfy the voltage threshold 725. The circuit 600 may make this determination using the sense component 634 in some examples. In some instances, the sense component 634 may compare the voltage level detected at the second node 628 to a reference voltage to identify with the voltage threshold 725 is satisfied. At time t1, the sense component 634 may output a signal to the latch 640 based on the voltage level at the second node 628 satisfying the voltage threshold 725. The voltage threshold 725 may be modified or altered based on circuit operation or changes in the access operations.

A duration 730 may be defined between the beginning of charging the digit line 604 and/or memory cell 602 at time t0 and when the voltage level satisfies the voltage threshold 725 at time t1. The duration 730 may correspond to one of the durations described with reference to FIG. 5. The duration 730 may vary based on the memory state of the memory cell 602 at time to when the charging begins. The starting voltage levels of both the digit line 604 and the second node 628 may also vary based on the memory state of the memory cell 602 at time t0 when the charging begins. For example, the starting voltage levels for memory state A (described with reference to FIGS. 3 and 5) may be higher than memory state D (described with reference to FIGS. 3 and 5). In some examples, the signals 705, 710 may vary based on the memory state of the memory cell 602 at time t0 when the charging begins.

In some examples, the sense component 634 of the circuit 600 may be coupled to the digit line 604 at the first node 620. In those examples, the voltage threshold 725 may be set to be at or around the predetermined voltage level 715 that the digit line 604 and/or the memory cell 602 are being charged. It should be appreciated that the elements of the sense component 634 may be modified when the sense component 634 is coupled to digit line 604 to perform the functions described herein.

In some examples, the digit line 604 may be biased prior to starting the read operation. Biasing the digit line 604 may reduce disturbances of the logic state of unselected memory cells also coupled to the digit line 604. Biasing the digit line 604 before performing the read operation, in some cases, may not alter the durations taken to charge the digit line 604 during a sense portion of a read operation.

In some instances, a time-based read operation may be performed on a memory cell 602 without a latch and/or time-varying signals. In some instances, the controller 660 or memory controller 140 may determine a duration between beginning to charge the memory cell 602 and when the voltage threshold 725 is satisfied. The controller 660 or memory controller 140 may compare the duration to values of a look-up table. The look-up table may be configured to map durations to a particular logic state. In some examples, a timer may be initiated when the memory cell 602 begins to be charged. The duration of the sense portion of the read operation may be based on a value of the timer when the voltage threshold is satisfied.

A write back portion of the read operation may begin after the logic state of the memory cell 602 is identified. The controller 660 may identify the logic state of the memory cell 602 about or after time t1. The controller 660 may then determine what memory state should be written to the memory cell based on the identified logic state. In some examples, the memory state to be written back is the same memory state that was identified by the controller 660.

During a sense portion of a time-based read operation, the digit line 604 may be charged or biased to a high voltage. To write memory states to the memory cell 602, the memory cell 602 may be biased by the digit line 604 and the plate line 606. To write some memory states to the memory cell 602, the digit line 604 may be high and the plate line 606 may be low. To write other memory states to the memory cell 602, the digit line 604 may be low and the plate line 606 may be high.

As such, to write some memory states to the memory cell 602, the controller 660 may activate the switching component 664 to couple the plate line 606 to ground 674. Because the digit line 604 may already be high due to the charging during the sense portion of the read operation, the memory cell 602 may be biased to write back certain memory state to the memory cell 602.

In some instances, the digit line 604 may not be high at the beginning of a write operation or a write back portion of a read operation. In such instances, the controller 660 may activate one or more switching components (not shown) to couple the digit line 604 to a voltage source and the switching component 664 may be activated to couple the plate line 606 to ground. For example, during a normal write operation, the digit line 604 may be at a low value at the beginning of the write operation. In another example, the digit line 604 may be coupled to ground after the sense component detects that the threshold has been satisfied. Switching the memory cell 602 off during portions of the read operation may reduce the stress on the memory cell 602. In such examples, the digit line 604 may be coupled to one or more switching components that selectively couple the digit line 604 to ground.

To write other memory states to the memory cell 602, the controller 660 may activate the switching component 662 to couple the plate line 606 to a voltage source and may activate the switching component 666 to couple the digit line 604 to ground 674. In some cases, prior to activating the switching component 666, the charging component 622 may be deactivated.

In some examples, the controller 660 may deactivate the selection component 610 during a write operation or a write back operation. In such examples, the selection component 610 may be deactivated while the plate line 606 or the digit line 604 is high. Deactivating the selection component 610 may cause the middle electrode of the memory cell 602 to store a dielectric charge. In some examples, deactivating the selection component 610 may cause the capacitor 608 to store a dielectric charge. In some examples, a ferroelectric memory cell may be configured to store both a polarization state and a dielectric charge state by not discharging the middle electrode after a write operation or a write back operation.

In some examples, the memory cell 602 may be configured to store a plurality of memory states. As such, the controller 660 may be coupled to a plurality of switching components coupled to a plurality of voltage sources. Various combinations of these voltage sources may be used to obtain the proper biasing for the memory cell 602. For example, a memory cell 602 may be written with a memory state by coupling the digit line 604 to a first voltage and coupling the plate line 606 to a second voltage different from the voltage. The first and second voltage may be any voltage. The circuit 600 may include any number of control lines and switching components to properly write various memory states to the memory cell 602.

Figure 8:
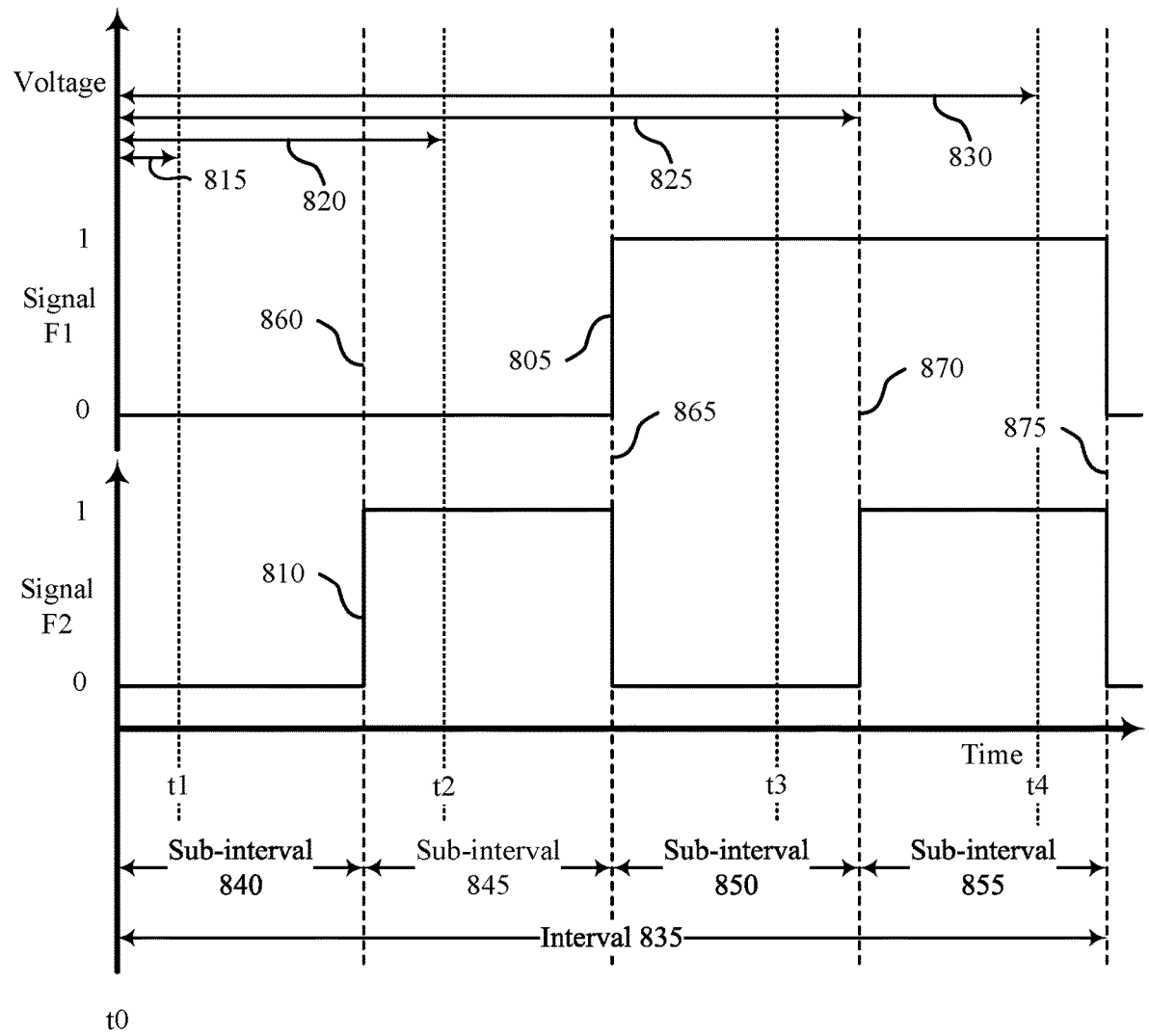
FIG. 8 illustrates an example of a timing diagram that supports time-based access of a memory cell in accordance with embodiments of the present disclosure.

FIG. 8 illustrates an example of a timing diagram 800 that supports time-based access of a memory cell in accordance with various embodiments of the present disclosure. The timing diagram 800 illustrates an examples of time-varying signals input into at least one latch (e.g., latch 640). The timing diagram 800 includes a first time-varying signal 805 and a second time-varying signal 810. In some examples, the time-varying signals 805, 810 may be input into a single latch (e.g., first latch 640). In some examples, the time-varying signals 805, 810 may be input into two latches (e.g., first latch 640 and second latch 644). The first time-varying signal 805 may be an example of the first time-varying signal 642 described with reference to FIG. 6. The second time-varying signal 810 may be an example of the second time-varying signal 646 described with reference to FIG. 6. In some examples, the amplitude of the signals 805, 810 may be varied over time. In other examples, other characteristics of the signals 805, 810 may be varied over time.

The first and second time-varying signals 805, 810 may be configured to define logic states stored on a memory cell 602. The first and second time-varying signals 805, 810 may be configured to represent logical '1s' and logical '0s' based on high and low voltage values. For example, a high voltage value of the time-varying signals 805, 810 may represent a logical '1' and a low voltage value may represent a logical '0.'

In a time-based read operation, the duration between the beginning of charging the memory cell 602 to a predetermined voltage level (e.g., voltage level 715) and satisfying a voltage threshold (e.g., voltage threshold 725) may be used to activate one or more latches (e.g., latches 640, 644). The value of the time-varying signals 805, 810 at the time the latches are activated may be used to identify the logic state of the memory cell 602. For example, if the charging of the memory cell 602 begins at time t0 and the voltage threshold is satisfied at time t1, the value of the first time-varying signal 805 may indicate that the first bit of a logic state of the memory cell 602 is a logical '0' and the second bit is a logical '0.'

The first and second time-varying signals 805, 810 may cooperate to map a logic state of the memory cell 602 to an associated memory state of the memory cell 602 based on the duration to charge the memory cell 602 during a read operation. Such time-based read operations may be used to distinguish between memory states not previously distinguishable in other memory cells. For example, a time-based read operation may be able to distinguish between a first memory state defined by zero polarization and a first level of dielectric charge and a second memory state defined by a first polarization and the first level of dielectric charge. In some examples, time-based read operations may be configured to distinguish between different levels of dielectric charge alone or different levels of polarization alone, or change in both.

The first and second time-varying signals 805, 810 may be based on expected durations of charging associated with different memory states of a memory cell 602. As used in FIG. 8, the time t1 may represent the time at which the voltage satisfies the voltage threshold during a read operation when the memory cell 602 stores the memory state A. A duration 815 defined between time t0 and time t1 may correspond to duration 530 described with reference to FIG. 5. As used in FIG. 8, the time t2 may represent the time at which the voltage satisfies the voltage threshold during a read operation when the memory cell 602 stores the memory state B. A duration 820 defined between time t0 and time t2 may correspond to duration 540 described with reference to FIG. 5. As used in FIG. 8, the time t3 may represent the time at which the voltage satisfies the voltage threshold during a read operation when the memory cell 602 stores the memory state C. A duration 825 defined between time t0 and time t3 may correspond to duration 550 described with reference to FIG. 5. As used in FIG. 8, the time t4 may represent the time at which the voltage satisfies the voltage threshold during a read operation when the memory cell 602 stores the memory state D. A duration 830 defined between time t0 and time t4 may correspond to duration 555 described with reference to FIG. 5.

The first and second time-varying signals 805, 810 may be configured to extend for an overall interval 835. The overall interval 835 may include a number of subintervals. Each subinterval may define a unique logic state of the memory cell 602. For instance, in the examples where the memory cell 602 is configured to store four memory states, the first and second time-varying signals 805-, 810 may define four subintervals. Each subinterval may be associated with a separate memory state of the memory cell 602. Each subinterval may be associated with an expected duration for charging for a separate memory state of the memory cell 602.

A subinterval may represent a time period during which a single logic state of the memory cell 602 is represented by one or more time-varying signals. In the illustrative example, two time-varying signals are used to represent the possible logical states of a memory cell 602. However, in other examples, other number of time-varying signals may be used to represent the possible logical states of a memory cell 602 (e.g., one time-varying signal, three time-varying signals, etc.). The first and second time-varying signals 805, 810 may include a first subinterval 840, a second subinterval 845, a third subinterval 850, and fourth subinterval 855. In the representative example of FIG. 8, the first subinterval 840 may represent a logical '00,' the second subinterval 845 may represent a logical '01,' the third subinterval 850 may represent a logical '10,' and a fourth subinterval 855 may represent a logical '11.' In some examples, the first time-varying signal 805 may represent a most-significant bit of a logic state identifier and the second time-varying signal 810 may represent a least-significant bit of a logic state identifier. In some examples, a single time-varying signal may represent more two or more bits of a logic state identifier.

Each subinterval may be separated by a transition. A transition may refer to a change in the voltage level of one of the time-varying signals or both of the time-varying signals. The change in the voltage level may represent a change in the logic state be represented by the one or more time-varying signals. The first subinterval may extend between an initial transition at time t0 (e.g., the beginning of applying the time-varying signal) and a first transition 860. The second subinterval 845 may extend between the first transition 860 and a second transition 865. The third subinterval 850 may extend between the second transition 865 and a third transition 870. The fourth subinterval 855 may extend between the third transition 870 and a fourth transition 875 or an ending transition.

At the first transition 860, the first time-varying signal 805 may not alter its voltage value and the second time-varying signal 810 may alter its voltage value from a low voltage value to a high voltage value. At the second transition 865, the first time-varying signal 805 may alter its voltage value from low to high and the second time-varying signal 810 may alter its voltage value from high to low. At the third transition 870, the first time-varying signal 805 may not alter its voltage value and the second time-varying signal 810 may alter its voltage value from low to high. At the fourth transition 875, the first time-varying signal 805 may alter its voltage value from high to low and the second time-varying signal 810 may alter its voltage value from high to low.

In some examples, the subintervals may span equal lengths of time. However, in other examples, the subintervals may span different lengths of the time. The transitions of the time-varying signals between logical states may be positioned to distinguish between memory states of the memory cell 602. Because a read operation may not produce equally spaced apart durations for satisfying voltage thresholds, similarly the thresholds between logical states may not be equally spaced.

The first and second time-varying signals 805, 810 may be used in conjunction with the memory states A-D shown and described with reference to FIGS. 3 and 5. In such an example, the subinterval 840 may be associated with the memory state A (e.g., memory state 340 (State A)), the subinterval 845 may be associated with the memory state B (e.g., memory state 305 (State B)), the subinterval 850 may be associated with the memory state C (e.g., memory state 310 (State C)), and the subinterval 855 may be associated with the memory state D (e.g., memory state 345 (State D)). As such, in this example, memory state A may be mapped to a logical '00,' memory state B may be mapped to a logical '01,' memory state C may be mapped to a logical '10,' and memory state D may be mapped to a logical '11.' In some examples, the time-varying signals may be configured to map the memory states to any logic state. The mapping shown FIG. 8 is provided for illustrative purposes only.

In some examples, the time-varying signal(s) may be configured such that a first bit of a logic state identifier may be identified after a first duration shorter than a second duration to determine a second bit of the logic state identifier. For example, at transition 865 the controller 660 may be able to determine whether one of the bits is a logical '1' or a logical '0.' If the voltage threshold has not been satisfied by the transition 865, then the controller 660 may determine that the first bit is a logical '1.' This type of determination may be accomplished through an inference. In some examples, if the voltage threshold has not been satisfied by the transition 870, the controller 660 may determine that logical state identifier is a logical '11.' Such a determination may be done by inference because during the time-based sense there is no longer any ability to determine that any of the other three logic states represented in the timing diagram 800 is stored by the memory cell 602. In some examples, the overall interval 835 of the time-varying signals may terminate at transition 870. As such, the time-varying signals may include three subintervals 840, 845, 850 and not include subinterval 855. In other examples, however, the time-varying signals extend to the transition 875 to identify whether an error has occurred during a read operation. If the voltage threshold is never satisfied during the interval 835, then the controller 660 may determine that an error in the read operation occurred.

Figure 9:
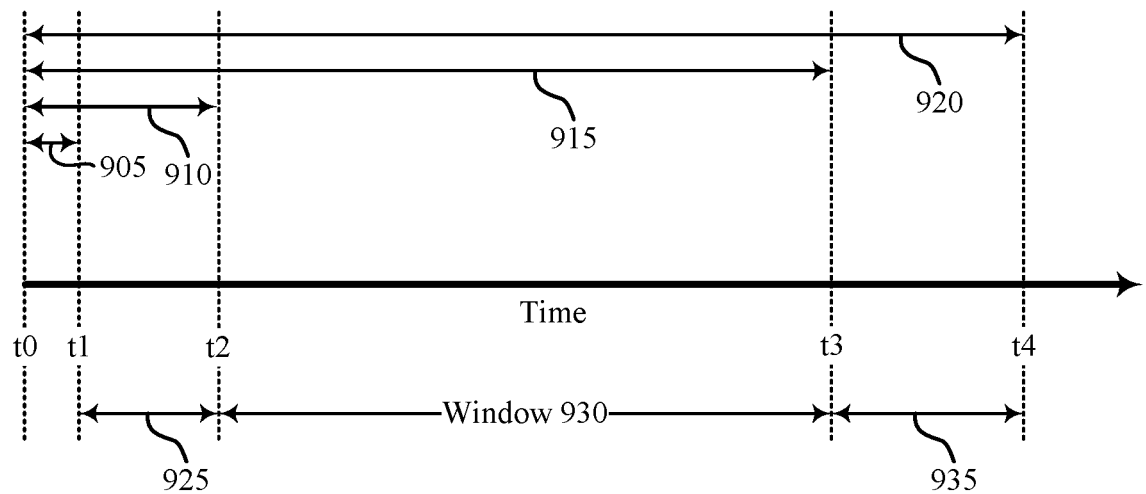
FIG. 9 illustrates an example of a timing diagram that supports time-based access of a memory cell in accordance with embodiments of the present disclosure.
Figure 9:
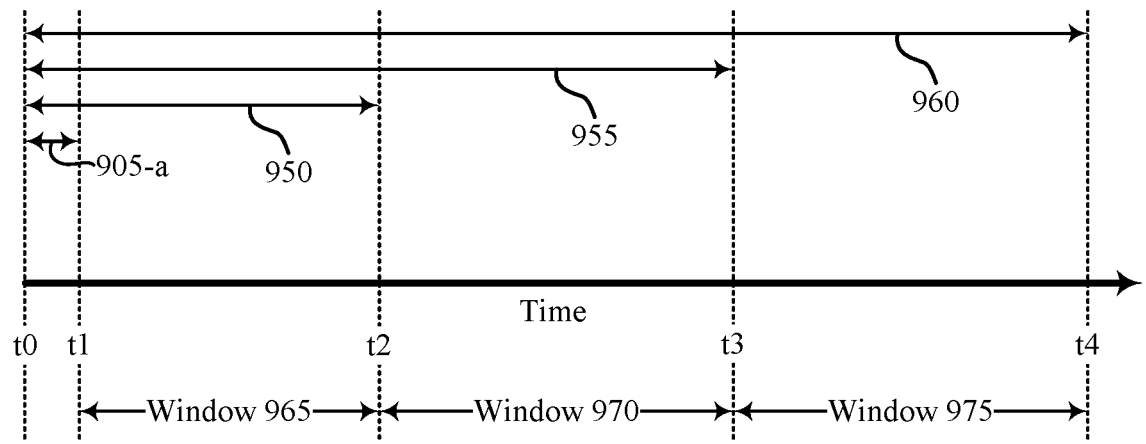

FIG. 9 illustrates an example of timing diagrams 900 that support time-based access of a memory cell in accordance with various embodiments of the present disclosure. The timing diagrams 900 represent expected durations for charging for various memory state of the memory cell 602. The timing diagram 900-a may represent the expected durations for charging when the charging component 622 applies a constant current to the digit line 604 as part of the read operation. The timing diagram 900-b may represent the expected durations for charging when the charging component 622 applies a time-varying current to the digit line 604 as part of the read operation.

The duration of time taken to charge the digit line 604 and/or the memory cell 602 may be based on the characteristics of the components of the memory device. Because characteristics of components (e.g., capacitance) of the memory device are fixed, the duration to charge the memory cell 602 may be based on the memory state of the memory cell 602 and how that memory state interacts with the other fixed characteristics of the components of the circuit.

For example, if the capacitances associated with the circuit are fixed and the charging component applies a constant current or a constant power supply during charging, expected values of the durations associated with each memory state may be determined. At time t0, the charging of the memory cell 602 as part of a sense portion of a read operation begins. At time t1, a memory cell 602 having the memory state A (e.g., memory state 340 (State A)) satisfies the voltage threshold. In some examples, a duration 905 defined between time t0 and time t1 is about zero nanoseconds. In some instances, the duration 905 may be more than zero nanoseconds such as 0.2 nanoseconds, 0.4 nanoseconds, 0.6 nanoseconds, 0.8 nanoseconds, 1.0 nanoseconds, etc. Frequently, the voltage threshold and the predetermined voltage for charging may be set based on one of the memory states of the memory cell 602. As such, one of the memory states of the memory cell 602 may satisfy the voltage threshold quickly, and sometimes instantaneously after charging begins. Time t1 is shown as different from time t0 for illustrative purposes only. In some examples, time t1 occurs at or directly after time t0.

At time t2, a memory cell 602 having the memory state B (e.g., memory state 305 (State B)) satisfies the voltage threshold. In some examples, a duration 910 defined between time t0 and time t2 is about ten nanoseconds. In some instances, the duration 910 may range between 7 nanoseconds and 13 nanoseconds, 7.5 nanoseconds and 12.5 nanoseconds, 8 nanoseconds and 12 nanoseconds, 8.5 nanoseconds and 11.5 nanoseconds, 9.0 nanoseconds and 11 nanoseconds, or 9.5 nanoseconds and 10.5 nanoseconds.

At time t3, a memory cell 602 having the memory state C (e.g., memory state 310 (State C)) satisfies the voltage threshold. In some examples, a duration 615 defined between time t0 and time t3 is about forty-two nanoseconds. In some instances, the duration 915 may range between 35 nanoseconds and 49 nanoseconds, 36 nanoseconds and 48 nanoseconds, 37 nanoseconds and 47 nanoseconds, 38 nanoseconds and 46 nanoseconds, 39 nanoseconds and 45 nanoseconds, 40 nanoseconds and 44 nanoseconds, 41.0 nanoseconds and 43 nanoseconds or 41.5 nanoseconds and 42.5 nanoseconds.

At time t4, a memory cell 602 having the memory state D (e.g., memory state 345 (State D)) satisfies the voltage threshold. In some examples, a duration 920 defined between time t0 and time t4 is about fifty-two nanoseconds. In some instances, the duration 920 may range between 45 nanoseconds and 59 nanoseconds, 46 nanoseconds and 58 nanoseconds, 47 nanoseconds and 57 nanoseconds, 48 nanoseconds and 56 nanoseconds, 49 nanoseconds and 55 nanoseconds, 50 nanoseconds and 54 nanoseconds, 51.0 nanoseconds and 53 nanoseconds, or 51.5 nanoseconds and 52.5 nanoseconds.

The relationships between the durations 910, 915, 920 may be based on the capacitances of the circuit. Because the design of the circuit and the characteristics of those circuit components is relatively constant, applying a constant current may yield predictable durations for charging the memory cell 602 based on the memory states. The durations and range values described above may be based on a value of the current used to charge the memory cell 602 and/or the digit line 604. Thus, in some cases, a high higher may result in less time to satisfy the threshold (e.g., twice the current may result in half the time to satisfy the threshold).

As should be appreciated, the durations of timing diagram 900-a may make distinguishing between some memory states to be more difficult than distinguishing between other memory states. A first sense window 925 based on time between memory state A (time t1) and memory state B (time t2) may be about ten nanoseconds, in this example. A second sense window 930 based on time between memory state B (time t2) and memory state C (time t3) may be about thirty-two nanoseconds. A third sense window 935 based on time between memory state C (time t3) and memory state D (time t4) may be about ten nanoseconds.

Because of the relative durations of the sense windows 925, 930, 935, it may be more difficult or less difficult to distinguish between memory states in a time-based read operation. For example, because the first sense window 925 is about ten nanoseconds and the second sense window 930 is about three times the size of the first sense window, it may be easier to distinguish between memory state B and memory state C than it is to distinguish between memory state A and memory state B.

In some examples, the current or power source applied to the memory cell 602 during a sense portion of a read operation may be varied over time. Such a time-varying current may be configured to distribute the durations for charging in a predetermined manner. For example, a time-varying current applied by the charging component 622 may be configured to provide equally sized sense windows based on time. In some examples, the amplitude of the current may be varied over time. In other examples, other characteristics of the current may be varied over time.

The timing diagram 900-b illustrates durations and sense windows associated with a sense portion of a time-based read operation. In the read operation, a time-varying current is applied. The time-varying current is configured to change the charge times associated different memory states. For example, a duration 950 associated with memory state B may be longer than a duration 910. In another example, a duration 955 associated with memory state C may be shorter than the duration 915. In some examples, the duration 960 associated with memory state D may be different than the duration 920. In some examples, the time-varying current may be configured to make the duration 960 shorter than the duration 920 and thereby reduce the overall time taken during a sense portion of a read operation. In some examples, the time-varying current may be configured to provide predetermined sense windows, and as such the duration 960 may be longer than the duration 920.

The sense windows 965, 970, 975 in the timing diagram 900-b may be about equal in length of time. The length of time of the sense windows 965, 970, 975 may be based on the configuration of the time-varying current applied while charging the memory cell 602. In some examples, other configurations of durations and sense windows may be based on different current profiles of the time-varying current applied while charging the memory cell 602.

Figure 10:
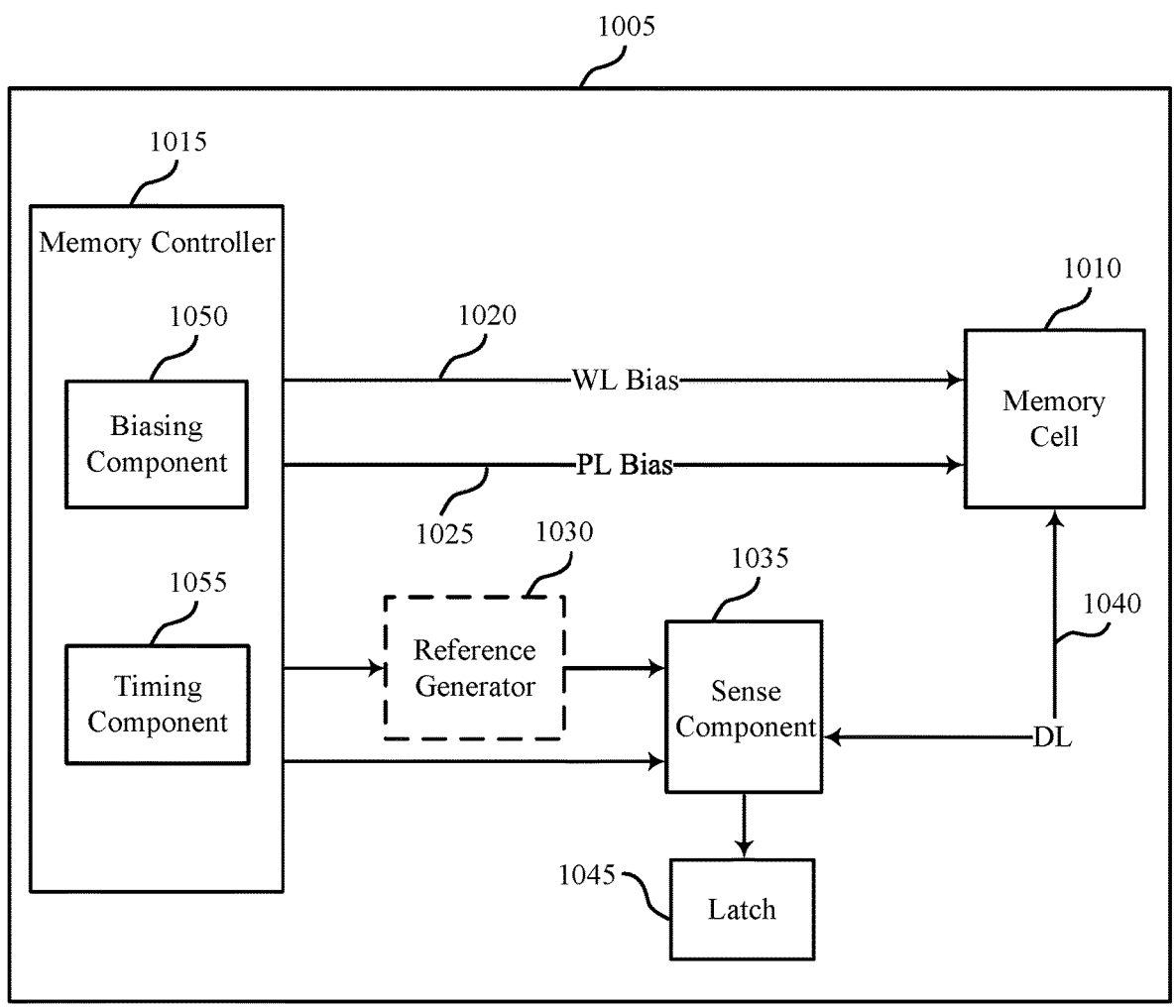
FIGS. 10 through 11 show block diagrams of a device that supports time-based access of a memory cell in accordance with embodiments of the present disclosure.

FIG. 10 shows a block diagram 1000 of a memory array 1005 that supports time-based access of a memory cell in accordance with various embodiments of the present disclosure. Memory array 1005 may be referred to as an electronic memory apparatus, and may be an example of a component of a memory controller 140 as described with reference to FIG. 1.

Memory array 1005 may include one or more memory cells 1010, a memory controller 1015, a word line 1020, a plate line 1025, a reference component 1030, a sense component 1035, a digit line 1040, and a latch 1045. These components may be in electronic communication with each other and may perform one or more of the functions described herein. In some cases, memory controller 1015 may include biasing component 1050 and timing component 1055. In some examples, the memory controller 1015 may be an example of a memory controller 140 as described with reference to FIG. 1. In some examples, the memory controller 1015 may be an example of a controller 660 as described with reference to FIG. 6. In some examples, the memory controller 1015 may be an example of both the memory controller 140 and the controller 660.

Memory controller 1015 may be in electronic communication with word line 1020, digit line 1040, sense component 1035, and plate line 1025, which may be examples of word line 110, digit line 115, sense component 125, and plate line 210 described with reference to FIGS. 1, and 2. Memory array 1005 may also include reference component 1030 and latch 1045. The components of memory array 1005 may be in electronic communication with each other and may perform portions of the functions described with reference to FIGS. 1 through 9. In some cases, reference component 1030, sense component 1035, and latch may be components of memory controller 1015.

In some examples, digit line 1040 is in electronic communication with sense component 1035 and a ferroelectric capacitor of ferroelectric memory cells 1010. A ferroelectric memory cell 1010 may be writable with a logic state (e.g., a first or second logic state). Word line 1020 may be in electronic communication with memory controller 1015 and a selection component of ferroelectric memory cell 1010. Plate line 1025 may be in electronic communication with memory controller 1015 and a plate of the ferroelectric capacitor of ferroelectric memory cell 1010. Sense component 1035 may be in electronic communication with memory controller 1015, digit line 1040, latch 1045, and reference line 1060. Reference component 1030 may be in electronic communication with memory controller 1015 and reference line 1060. Sense control line 1065 may be in electronic communication with sense component 1035 and memory controller 1015. These components may also be in electronic communication with other components, both inside and outside of memory array 1005, in addition to components not listed above, via other components, connections, or busses.

Memory controller 1015 may be configured to activate word line 1020, plate line 1025, or digit line 1040 by applying voltages to those various nodes. For example, biasing component 1050 may be configured to apply a voltage to operate memory cell 1010 to read or write memory cell 1010 as described above. In some cases, memory controller 1015 may include a row decoder, column decoder, or both, as described with reference to FIG. 1. This may enable memory controller 1015 to access one or more memory cells 105. Biasing component 1050 may also provide voltage potentials to reference component 1030 in order to generate a reference signal for sense component 1035. Additionally, biasing component 1050 may provide voltage potentials for the operation of sense component 1035.

In some cases, memory controller 1015 may perform its operations using timing component 1055. For example, timing component 1055 may control the timing of the various word line selections or plate biasing, including timing for switching and voltage application to perform the memory functions, such as reading and writing, discussed herein. In some cases, timing component 1055 may control the operations of biasing component 1050. In some examples, the timing component 1055 may cooperate to generate the F1 signal and/or the F2 signal.

Reference component 1030 may include various components to generate a reference signal for sense component 1035. Reference component 1030 may include circuitry configured to produce a reference signal. In some cases, reference component 1030 may be implemented using other ferroelectric memory cells 105. Sense component 1035 may compare a signal from memory cell 1010 (through digit line 1040) with a reference signal from reference component 1030. Upon determining the logic state, the sense component may then store the output in latch 1045, where it may be used in accordance with the operations of an electronic device that memory array 1005 is a part. Sense component 1035 may include a sense amplifier in electronic communication with the latch and the ferroelectric memory cell.

Memory controller 1015 may be an example of portions of the memory controller 1215 described with reference to FIG. 12. Memory controller 1015 and/or at least some of its various sub-components may be implemented in hardware, software executed by a processor, firmware, or any combination thereof. If implemented in software executed by a processor, the functions of the memory controller 1015 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 1015 and/or at least some of its various sub-components may be physically located at various positions, including being distributed such that portions of functions are implemented at different physical locations by one or more physical devices. In some examples, memory controller 1015 and/or at least some of its various sub-components may be a separate and distinct component in accordance with various embodiments of the present disclosure. In other examples, memory controller 1015 and/or at least some of its various sub-components may be combined with one or more other hardware components, including but not limited to an I/O component, a transceiver, a network server, another computing device, one or more other components described in the present disclosure, or a combination thereof in accordance with various embodiments of the present disclosure.

Memory controller 1015 may charge a digit line coupled to a memory cell to a first voltage level, determine a duration for the digit line to charge to the first voltage level, and identify a logic state of the memory cell based on the duration for the digit line to reach the first voltage level. The memory controller 1015 may also force a current into a ferroelectric memory cell coupled to a digit line, the ferroelectric memory cell configured to store at least three logic states, sense a voltage at a node different from the digit line, the voltage based on a first voltage level of the digit line, and identify a logic state of the ferroelectric memory cell from the at least three logic states based on the voltage satisfying a voltage threshold. The memory controller 1015 may also apply a time-varying signal to a latch after initiating a read operation on a memory cell, activate the latch based on a digit line that is coupled to the memory cell charging to a first voltage level as part of the read operation, and identify a logic state of the memory cell based on a value of the time-varying signal present at the latch when the latch is activated. The memory controller 1015 may also sense a first state of a ferroelectric capacitor in a ferroelectric memory cell, sense a second state of the ferroelectric capacitor different from the first state, and identify a logic state of the ferroelectric memory cell from at least three logic states based on the first state and the second state. The memory controller 1015 may also activate a selection component of a ferroelectric memory cell, modify a first state of a ferroelectric capacitor of the ferroelectric memory cell based on a voltage being applied to the ferroelectric memory cell while the selection component is activated, deactivate the selection component, and modify a second state of the ferroelectric capacitor based on the selection component being deactivated while the voltage is applied to the ferroelectric memory cell.

In some cases, the memory array 1005 may include various means for operating the memory array 1005. For example, the memory array 1005 and/or the memory controller 1015 may include means for performing the functions described above with reference to FIG. 13.

The memory array 1005 may include means for charging a digit line coupled to a memory cell to a first voltage level, means for determining a duration for the digit line to charge to the first voltage level, and means for identifying a logic state of the memory cell based at least in part on the duration for the digit line to reach the first voltage level.

Some examples of the memory array 1005 described above may further include processes, features, means, or instructions for varying an amplitude of a current applied to the digit line over time, wherein the duration is based at least in part on the time-varying current. Some examples of the memory array 1005 described above may further include processes, features, means, or instructions for selecting the memory cell from a plurality of memory cells based at least in part on a read operation being initiated.

Some examples of the memory array 1005 described above may further include processes, features, means, or instructions for initiating a timer based at least in part on performing a read operation on the memory cell, wherein the duration may be determined based at least in part on the timer. In some examples of the memory array 1005 described above, the duration may be determined based at least in part on an amount of time that elapses between initiating a timer and the digit line charging to the first voltage level.

Some examples of the memory array 1005 described above may further include processes, features, means, or instructions for determining that a second voltage level at a node different from the digit line satisfies a voltage threshold, wherein the duration may be based at least in part on the second voltage level satisfying the voltage threshold.

Some examples of the memory array 1005 described above may further include processes, features, means, or instructions for sensing, by a sense component, the second voltage level at the node, wherein the logic state may be identified based at least in part on the second voltage level satisfying the threshold. In some examples of the memory array 1005 described above, the voltage threshold may be less than a biasing voltage used to generate a stable state of the memory cell.

Some examples of the memory array 1005 described above may further include processes, features, means, or instructions for identifying a value of a time-varying signal based at least in part on the duration, wherein the logic state may be based at least in part on the value of the time-varying signal. Some examples of the memory array 1005 described above may further include processes, features, means, or instructions for biasing the digit line prior to charging the digit line with the first voltage level.

Some examples of the memory array 1005 described above may further include processes, features, means, or instructions for identifying a first bit of the logic state after a second duration less than the duration. Some examples of the memory array 1005 described above may further include processes, features, means, or instructions for identifying a second bit of the logic state after the duration. In some examples of the memory array 1005 described above, the first voltage level to which the digit line may be charged may be a predetermined voltage level based at least in part on at least on one of a plurality of possible charge states of the memory cell.

In some examples of the memory array 1005 described above, the digit line may be charged by a cascode coupled to the digit line and to a sense component. In some examples of the memory array 1005 described above, the duration may be based at least in part on a stable state of a capacitor of the memory cell and a volatile state of the capacitor of the memory cell.

In some examples of the memory array 1005 described above, the memory cell includes a ferroelectric capacitor. In some examples of the memory array 1005 described above, the memory cell includes a dielectric capacitor. In some examples of the memory array 1005 described above, the memory cell may be configured to store at least three logic states. In some examples of the memory array 1005 described above, the memory cell may be configured to store two logic states.

The memory array 1005 may include means for applying a current to a ferroelectric memory cell coupled to a digit line, the ferroelectric memory cell configured to store at least three logic states, means for sensing a voltage at a node different from the digit line, the voltage based at least in part on a first voltage level of the digit line, and means for identifying a logic state of the ferroelectric memory cell from the at least three logic states based at least in part on the voltage satisfying a voltage threshold.

Some examples of the memory array 1005 described above may further include processes, features, means, or instructions for identifying a duration for a second voltage level present on the node to satisfy the voltage threshold, wherein the logic state may be identified based at least in part on the duration.

In some examples of the memory array 1005 described above, the duration may be based at least in part on a total charge stored on a ferroelectric capacitor of the ferroelectric memory cell. In some examples of the memory array 1005 described above, the total charge comprises a volatile charge of the ferroelectric capacitor and a stable charge of the ferroelectric capacitor.

Some examples of the memory array 1005 described above may further include processes, features, means, or instructions for identifying the logic state of the ferroelectric memory cell may be based at least in part on a polarization state of a ferroelectric capacitor of the ferroelectric memory cell and a charge state of the ferroelectric capacitor of the ferroelectric memory cell.

Some examples of the memory array 1005 described above may further include processes, features, means, or instructions for outputting, by a sense component, a signal based at least in part on the voltage satisfying the voltage threshold. Some examples of the memory array 1005 described above may further include processes, features, means, or instructions for activating a first latch based at least in part on the voltage satisfying the voltage threshold. Some examples of the memory array 1005 described above may further include processes, features, means, or instructions for activating a second latch different from the first latch based at least in part on the voltage satisfying the voltage threshold.

Some examples of the memory array 1005 described above may further include processes, features, means, or instructions for applying a first time-varying signal to the first latch. Some examples of the memory array 1005 described above may further include processes, features, means, or instructions for applying a second time-varying signal to the second latch different from the first time-varying signal, wherein the logic state of the ferroelectric memory cell may be based at least in part on values of the first time-varying signal and the second time-varying signal when the first latch and the second latch may be activated.

Some examples of the memory array 1005 described above may further include processes, features, means, or instructions for activating a selection component of the ferroelectric memory cell, wherein the current may be forced based at least in part on the selection component being activated.

Some examples of the memory array 1005 described above may further include processes, features, means, or instructions for activating a selection component of the ferroelectric memory cell while a plate line and the digit line coupled to the ferroelectric memory cell may be grounded or virtually grounded.

Some examples of the memory array 1005 described above may further include processes, features, means, or instructions for performing a write-back operation on the ferroelectric memory cell based at least in part on the identified logic state of the ferroelectric memory cell. In some examples of the memory array 1005 described above, the current may be forced based at least in part on performing a read operation on the ferroelectric memory cell.

Some examples of the memory array 1005 described above may further include processes, features, means, or instructions for charging, by a current generator, the digit line to the first voltage level based at least in part on applying the current. In some examples of the memory array 1005 described above, the current may be forced by a current generator coupled to the digit line and the node.

The memory array 1005 may include means for applying a time-varying signal to a latch after initiating a read operation on a memory cell, means for activating the latch based at least in part on a digit line that is coupled to the memory cell charging to a first voltage level as part of the read operation, and means for identifying a logic state of the memory cell based at least in part on a value of the time-varying signal present at the latch when the latch is activated.

Some examples of the memory array 1005 described above may further include processes, features, means, or instructions for isolating the memory cell from the latch after the digit line charges to the first voltage as part of the read operation.

In some examples of the memory array 1005 described above, the memory cell may be configured to store at least three logic states. In some examples of the memory array 1005 described above, the identified logic state of the memory cell may be selected from the at least three logic states.

Some examples of the memory array 1005 described above may further include processes, features, means, or instructions for applying a second time-varying signal to a second latch based at least in part on performing the read operation on the memory cell, the second time-varying signal different from the time-varying signal, the second latch different from the latch.

Some examples of the memory array 1005 described above may further include processes, features, means, or instructions for activating the second latch based at least in part on the digit line that may be coupled to the memory cell charging to the first voltage level, wherein identifying the logic state of the memory cell may be based at least in part on the time-varying signal present at the latch and the second time-varying signal present at the second latch when the latch and the second latch may be activated.

In some examples of the memory array 1005 described above, a configuration of the second time-varying signal may be based at least in part on a configuration of the time-varying signal, wherein the time-varying signal and the second time-varying signal cooperate to define at least three logic states. Some examples of the memory array 1005 described above may further include processes, features, means, or instructions for charging the digit line of the memory cell as part of the read operation, wherein the time-varying signal may be applied when charging the digit line begins.

Some examples of the memory array 1005 described above may further include processes, features, means, or instructions for sensing a second voltage level at a node different from the digit line, wherein the latch may be activated based at least in part on the second voltage level satisfying a voltage threshold. Some examples of the memory array 1005 described above may further include processes, features, means, or instructions for outputting a signal based at least in part on the second voltage level satisfying the voltage threshold, wherein the latch may be activated based at least in part on the signal.

Some examples of the memory array 1005 described above may further include processes, features, means, or instructions for determining that a duration of the read operation satisfies a time threshold, wherein identifying the logic state of the memory cell may be based at least in part on the latch not activating prior to the duration satisfying the time threshold.

In some examples of the memory array 1005 described above, a configuration of the time-varying signal may be based at least in part on an expected charge of the memory cell and the first voltage level. In some examples of the memory array 1005 described above, the configuration of the time-varying signal may be based at least in part on a number of logic states the memory cell may be capable of storing.

In some examples of the memory array 1005 described above, the configuration of the time-varying signal may be based at least in part on a number of latches used in the read operation. In some examples of the memory array 1005 described above, a configuration of the time-varying signal and an interval of the time-varying signal may be predetermined. In some examples of the memory array 1005 described above, a value of the time-varying signal varies in a predetermined manner over a predetermined interval of the time-varying signal.

The memory array 1005 may include means for sensing a first state of a ferroelectric capacitor in a ferroelectric memory cell, means for sensing a second state of the ferroelectric capacitor different from the first state, and means for identifying a logic state of the ferroelectric memory cell from at least three logic states based at least in part on the first state and the second state. In some examples, sensing a first state of the ferroelectric capacitor and sensing a second state of the ferroelectric capacitor may comprise sensing a combined state of the sensing capacitor. In some cases, the combined state may be a combination (or superposition) of a polarized state and a dialectic charge state.

In some examples of the memory array 1005 described above, the first state of the ferroelectric capacitor may be associated with a polarization of the ferroelectric capacitor. In some examples of the memory array 1005 described above, the second state of the ferroelectric capacitor may be associated with a dielectric charge stored on the ferroelectric capacitor.

Some examples of the memory array 1005 described above may further include processes, features, means, or instructions for identifying a first bit of the logic state based at least in part on the first state. Some examples of the memory array 1005 described above may further include processes, features, means, or instructions for identifying a second bit of the logic state based at least in part on the second state.

Some examples of the memory array 1005 described above may further include processes, features, means, or instructions for activating at least two latches based at least in part on a voltage level of a node different from a digit line satisfying a voltage threshold.

Some examples of the memory array 1005 described above may further include processes, features, means, or instructions for applying a first time-varying signal to one of the at least two latches. Some examples of the memory array 1005 described above may further include processes, features, means, or instructions for applying a second time-varying signal different from the first time-varying signal to another of the at least two latches, wherein the logic state may be identifying based at least in part on values of the first time-varying signal and the second time-varying signal when activating the at least two latches.

Some examples of the memory array 1005 described above may further include processes, features, means, or instructions for identifying a duration for a first voltage level of a digit line to satisfy a voltage threshold during an access operation, the duration based at least in part on the first state of the ferroelectric capacitor, the second state of the ferroelectric capacitor, and a voltage applied to the digit line.

Some examples of the memory array 1005 described above may further include processes, features, means, or instructions for identifying a duration for a second voltage level of a node different from a digit line to satisfy a voltage threshold, the duration based at least in part on the first state of the ferroelectric capacitor and the second state of the ferroelectric capacitor.

The memory array 1005 may include means for activating a selection component of a ferroelectric memory cell, means for modifying a first state of a ferroelectric capacitor of the ferroelectric memory cell based at least in part on a voltage being applied to the ferroelectric memory cell while the selection component is activated, means for deactivating the selection component, and means for modifying a second state of the ferroelectric capacitor based at least in part on the selection component being deactivated while the voltage is applied to the ferroelectric memory cell.

Some examples of the memory array 1005 described above may further include processes, features, means, or instructions for activating the selection component while a plate line and a digit line coupled to the ferroelectric memory cell may be grounded or virtually grounded. In some examples of the memory array 1005 described above, modifying the first state of the ferroelectric capacitor comprises: applying a first voltage to the ferroelectric capacitor.

In some examples of the memory array 1005 described above, applying the first voltage to the ferroelectric capacitor comprises: applying a second voltage to a digit line coupled to the ferroelectric memory cell. Some examples of the memory array 1005 described above may further include processes, features, means, or instructions for applying a third voltage to a plate line coupled to the ferroelectric memory cell, the third voltage different from the second voltage, wherein the first voltage may be based at least in part on the second voltage and the third voltage. In some examples of the memory array 1005 described above, modifying the second state of the ferroelectric capacitor comprises: applying a fourth voltage to the ferroelectric capacitor.

In some examples of the memory array 1005 described above, applying the fourth voltage to the ferroelectric capacitor comprises: applying a fifth voltage to a digit line coupled to the ferroelectric memory cell, the selection component may be deactivated while the fifth voltage is applied to the ferroelectric memory cell, wherein the selection component may be positioned between the ferroelectric capacitor and a plate line coupled to the ferroelectric memory cell.

In some examples of the memory array 1005 described above, applying the fourth voltage to the ferroelectric capacitor comprises: applying a sixth voltage to a plate line coupled to the ferroelectric memory cell, the selection component may be deactivated while the sixth voltage is applied to the ferroelectric memory cell, wherein the selection component may be positioned between the ferroelectric capacitor and a digit line coupled to the ferroelectric memory cell.

In some examples of the memory array 1005 described above, the ferroelectric memory cell may be configured to store at least three logic states based at least in part on the first state of the ferroelectric capacitor and the second state of the ferroelectric capacitor. In some examples of the memory array 1005 described above, the first state may be a polarization state of the ferroelectric capacitor. In some examples of the memory array 1005 described above, the second state may be a dielectric charge state of the ferroelectric capacitor.

Figure 11:
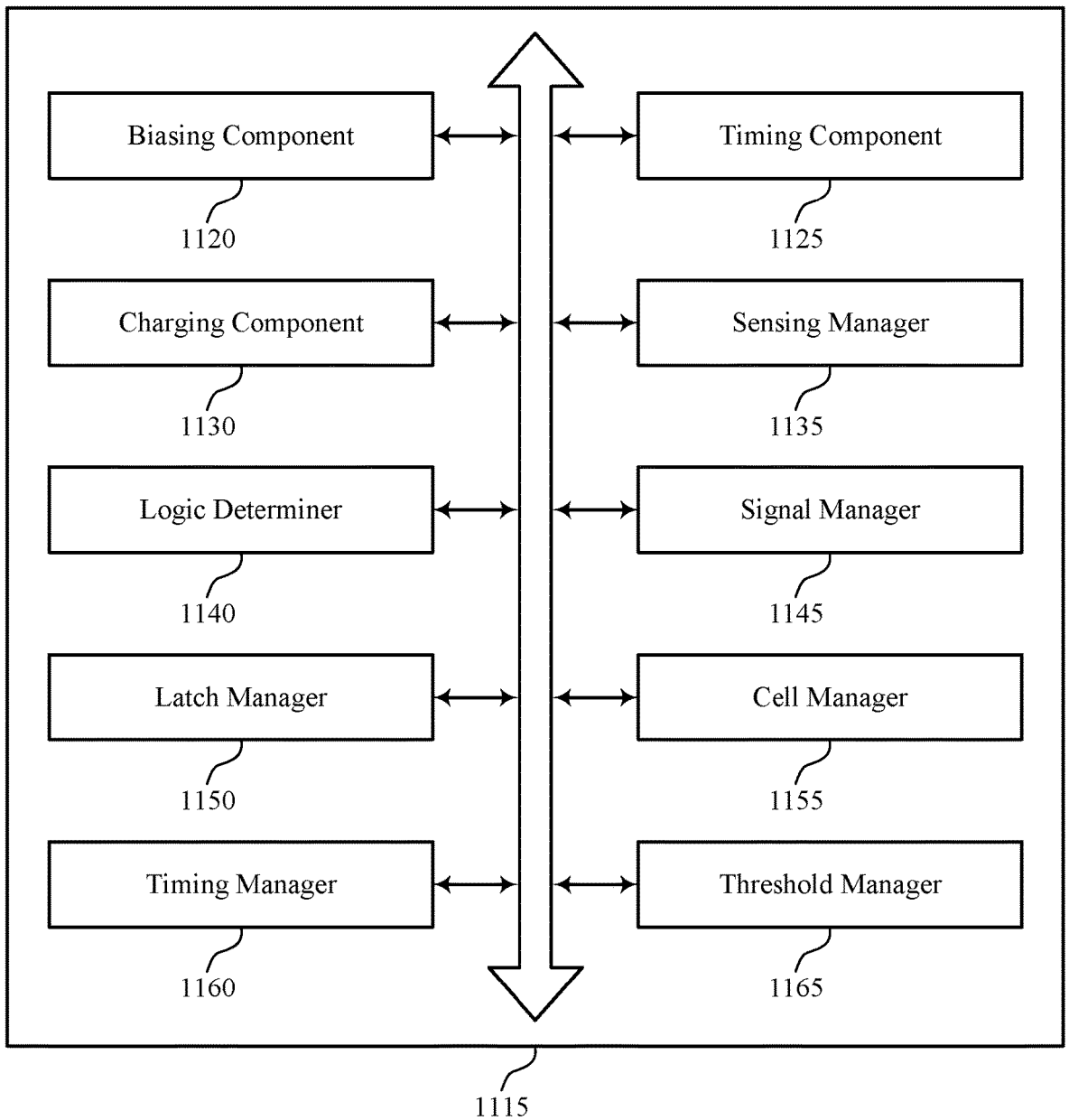

FIG. 11 shows a block diagram 1100 of a memory controller 1115 that supports time-based access of a memory cell in accordance with various embodiments of the present disclosure. The memory controller 1115 may be an example of portions of a memory controller 1215 described with reference to FIGS. 1, 10, and 12. The memory controller 1115 may include biasing component 1120, timing component 1125, charging component 1130, sensing manager 1135, logic determiner 1140, signal manager 1145, latch manager 1150, cell manager 1155, timing manager 1160, and threshold manager 1165. Each of these modules may communicate, directly or indirectly, with one another (e.g., via one or more buses).

Biasing component 1120 may bias the digit line prior to charging the digit line with the first voltage level.

Timing component 1125 may be configured to determine durations associated with read operation of a memory cell. For example, the timing component may be configured to determine a duration between beginning to charge a digit line of a memory cell and the firing of a latch. In some cases, the duration is determined based on an amount of time that elapses between initiating a timer and the digit line charging to the first voltage level.

Charging component 1130 may charge a digit line coupled to a memory cell to a first voltage level, vary a current applied to the digit line over time to charge the digit line, the time-varying current configured to modify a time interval associated with a specific logic state of the memory cell, force a current into a ferroelectric memory cell coupled to a digit line, the ferroelectric memory cell configured to store at least three logic states, charge, by a current generator, the digit line to the first voltage level based on applying the current, and charge the digit line of the memory cell as part of the read operation, where the time-varying signal is applied when charging the digit line begins. In some cases, the first voltage level to which the digit line is charged is a predetermined voltage level based on at least one of a set of possible charge states of the memory cell. In some cases, the digit line is charged by a cascode coupled to the digit line and to a sense component. In some cases, the current is forced based on performing a read operation on the ferroelectric memory cell. In some cases, the current is forced by a current generator coupled to the digit line and the node.

Sensing manager 1135 may determine a duration for the digit line to charge to the first voltage level, sense a voltage at a node different from the digit line, the voltage based on a first voltage level of the digit line, output, by a sense component, a signal based on the voltage satisfying the voltage threshold, sense a second voltage level at a node different from the digit line, where the latch is activated based on the second voltage level satisfying a voltage threshold, output a signal based on the second voltage level satisfying the voltage threshold, where the latch is activated based on the signal, sense a first state of a ferroelectric capacitor in a ferroelectric memory cell, and sense a second state of the ferroelectric capacitor different from the first state.

Logic determiner 1140 may identify a logic state of the memory cell based on the duration for the digit line to reach the first voltage level, identify a value of a time-varying signal based on the duration, where the logic state is based on the value of the time-varying signal, identify a first bit of the logic state after a second duration less than the duration, identify a second bit of the logic state after the duration, identify a logic state of the ferroelectric memory cell from the at least three logic states based on the voltage satisfying a voltage threshold, identify the logic state of the ferroelectric memory cell is based on a polarization state of a ferroelectric capacitor of the ferroelectric memory cell and a charge state of the ferroelectric capacitor of the ferroelectric memory cell, identify a logic state of the memory cell based on a value of the time-varying signal present at the latch when the latch is activated, identify a logic state of the ferroelectric memory cell from at least three logic states based on the first state and the second state, identify a first bit of the logic state based on the first state, and identify a second bit of the logic state based on the second state.

Signal manager 1145 may apply a time-varying signal to a latch after initiating a read operation on a memory cell, apply a second time-varying signal to a second latch based on performing the read operation on the memory cell, the second time-varying signal different from the time-varying signal, the second latch different from the latch, apply a first time-varying signal to one of the at least two latches, and apply a second time-varying signal different from the first time-varying signal to another of the at least two latches, where the logic state is identifying based on values of the first time-varying signal and the second time-varying signal when activating the at least two latches. In some cases, a configuration of the second time-varying signal is based on a configuration of the time-varying signal, where the time-varying signal and the second time-varying signal cooperate to define at least three logic states. In some cases, a configuration of the time-varying signal is based on an expected charge of the memory cell and the first voltage level. In some cases, the configuration of the time-varying signal is based on a number of logic states the memory cell is capable of storing. In some cases, the configuration of the time-varying signal is based on a number of latches used in the read operation. In some cases, a configuration of the time-varying signal and an interval of the time-varying signal is predetermined. In some cases, a value of the time-varying signal varies in a predetermined manner over a predetermined interval of the time-varying signal.

Latch manager 1150 may activate a first latch based on the voltage satisfying the voltage threshold, activate a second latch different from the first latch based on the voltage satisfying the voltage threshold, apply a first time-varying signal to the first latch, apply a second time-varying signal to the second latch different from the first time-varying signal, where the logic state of the ferroelectric memory cell is based on values of the first time-varying signal and the second time-varying signal when the first latch and the second latch are activated, activate the latch based on a digit line that is coupled to the memory cell charging to a first voltage level as part of the read operation, activate the second latch based on the digit line that is coupled to the memory cell charging to the first voltage level, where identifying the logic state of the memory cell is based on the time-varying signal present at the latch and the second time-varying signal present at the second latch when the latch and the second latch are activated, and activate at least two latches based on a voltage level of a node different from a digit line satisfying a voltage threshold.

Cell manager 1155 may select the memory cell from a set of memory cells based on a read operation being initiated, activate a selection component of the ferroelectric memory cell, where the current is forced based on the selection component being activated, activate a selection component of the ferroelectric memory cell while a plate line and the digit line coupled to the ferroelectric memory cell are grounded or virtually grounded, perform a write-back operation on the ferroelectric memory cell based on the identified logic state of the ferroelectric memory cell, isolate the memory cell from the latch after the digit line charges to the first voltage as part of the read operation, modify a first state of a ferroelectric capacitor of the ferroelectric memory cell based on a voltage being applied to the ferroelectric memory cell while the selection component is activated, deactivate the selection component, modify a second state of the ferroelectric capacitor based on the selection component being deactivated while the voltage is applied to the ferroelectric memory cell, activate the selection component while a plate line and a digit line coupled to the ferroelectric memory cell are grounded or virtually grounded, apply a third voltage to a plate line coupled to the ferroelectric memory cell, the third voltage different from the second voltage, where the first voltage is based on the second voltage and the third voltage, and activate a selection component of a ferroelectric memory cell.

In some cases, the second state is a dielectric charge state of the ferroelectric capacitor. In some cases, the memory cell includes a ferroelectric capacitor. In some cases, the memory cell includes a dielectric capacitor. In some cases, the memory cell is configured to store at least three logic states. In some cases, the memory cell is configured to store two logic states. In some cases, the memory cell is configured to store at least three logic states. In some cases, the identified logic state of the memory cell is selected from the at least three logic states. In some cases, the first state of the ferroelectric capacitor is associated with a polarization of the ferroelectric capacitor.

In some cases, the second state of the ferroelectric capacitor is associated with a dielectric charge stored on the ferroelectric capacitor. In some cases, the duration is based on a stable state of a capacitor of the memory cell and a volatile state of the capacitor of the memory cell. In some cases, modifying the first state of the ferroelectric capacitor includes: applying a first voltage to the ferroelectric capacitor. In some cases, applying the first voltage to the ferroelectric capacitor includes: applying a second voltage to a digit line coupled to the ferroelectric memory cell. In some cases, modifying the second state of the ferroelectric capacitor includes: applying a fourth voltage to the ferroelectric capacitor. In some cases, applying the fourth voltage to the ferroelectric capacitor includes: applying a fifth voltage to a digit line coupled to the ferroelectric memory cell, the selection component being deactivated while the fifth voltage is applied to the ferroelectric memory cell, where the selection component is positioned between the ferroelectric capacitor and a plate line coupled to the ferroelectric memory cell. In some cases, applying the fourth voltage to the ferroelectric capacitor includes: applying a sixth voltage to a plate line coupled to the ferroelectric memory cell, the selection component being deactivated while the sixth voltage is applied to the ferroelectric memory cell, where the selection component is positioned between the ferroelectric capacitor and a digit line coupled to the ferroelectric memory cell. In some cases, the ferroelectric memory cell is configured to store at least three logic states based on the first state of the ferroelectric capacitor and the second state of the ferroelectric capacitor. In some cases, the first state is a polarization state of the ferroelectric capacitor.

Timing manager 1160 may initiate a timer based on performing a read operation on the memory cell, where the duration is determined based on the timer, identify a duration for a second voltage level present on the node to satisfy the voltage threshold, where the logic state is identified based on the duration, determine that a duration of the read operation satisfies a time threshold, where identifying the logic state of the memory cell is based on the latch not activating prior to the duration satisfying the time threshold, identify a duration for a first voltage level of a digit line to satisfy a voltage threshold during an access operation, the duration based on the first state of the ferroelectric capacitor, the second state of the ferroelectric capacitor, and a voltage applied to the digit line, and identify a duration for a second voltage level of a node different from a digit line to satisfy a voltage threshold, the duration based on the first state of the ferroelectric capacitor and the second state of the ferroelectric capacitor. In some cases, the duration is based on a total charge stored on a ferroelectric capacitor of the ferroelectric memory cell. In some cases, the total charge includes a volatile charge of the ferroelectric capacitor and a stable charge of the ferroelectric capacitor.

Threshold manager 1165 may determine that a second voltage level at a node different from the digit line satisfies a voltage threshold, where the duration is based on the second voltage level satisfying the voltage threshold and sense, by a sense component, the second voltage level at the node, where the logic state is identified based on the second voltage level. In some cases, the voltage threshold is less than a biasing voltage used to generate a stable state of the memory cell.

Figure 12:
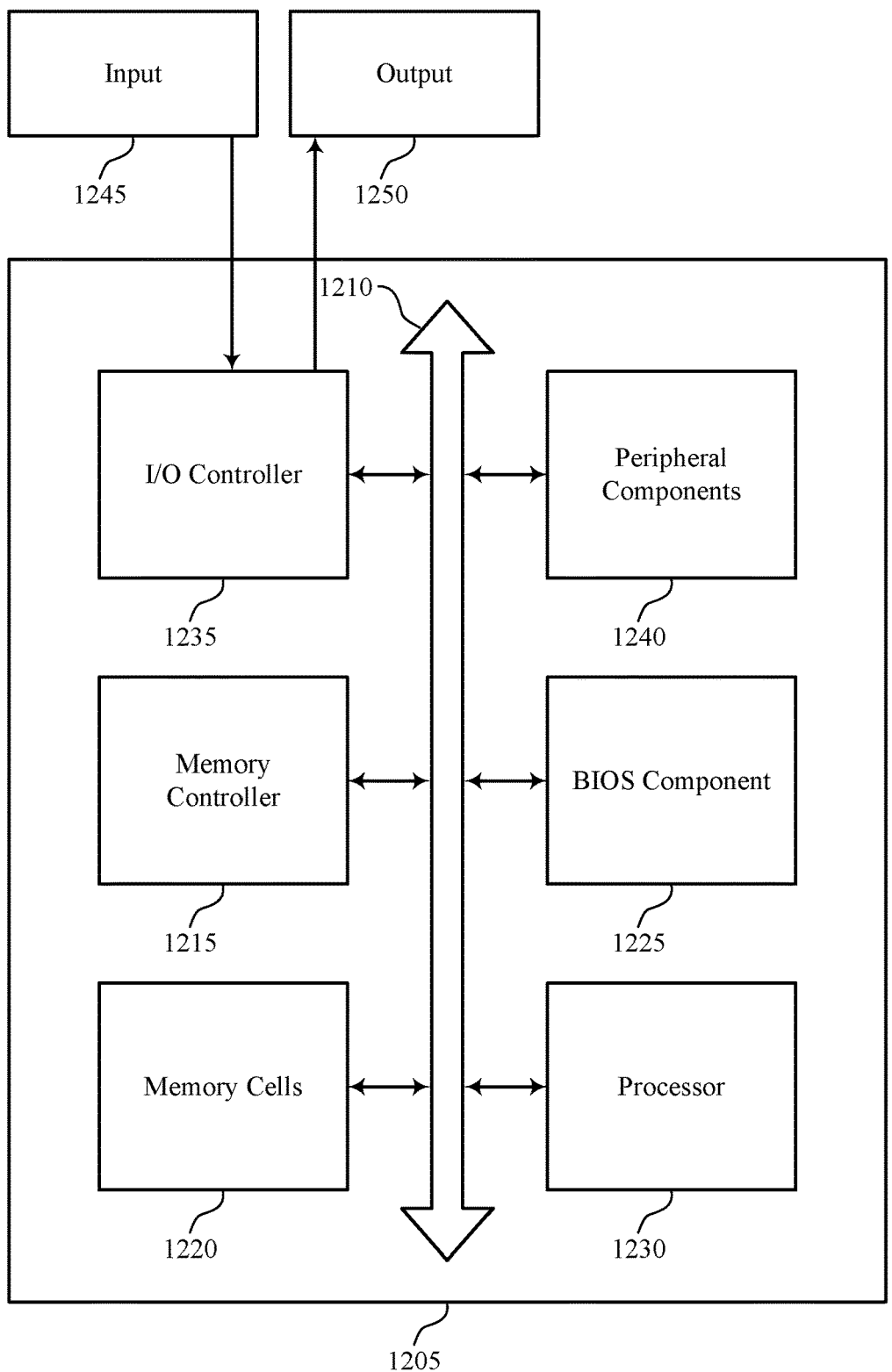
FIG. 12 illustrates a block diagram of a system including a memory controller that supports time-based access of a memory cell in accordance with embodiments of the present disclosure.

FIG. 12 shows a diagram of a system 1200 including a device 1205 that supports time-based access of a memory cell in accordance with various embodiments of the present disclosure. Device 1205 may be an example of or include the components of memory controller 1015 as described above, e.g., with reference to FIG. 10. Device 1205 may include components for bi-directional voice and data communications including components for transmitting and receiving communications, including memory controller 1215, memory cells 1220, basic input/output system (BIOS) component 1225, processor 1230, I/O controller 1235, and peripheral components 1240. These components may be in electronic communication via one or more busses (e.g., bus 1210). Memory cells 1220 may store information (i.e., in the form of a logical state) as described herein.

BIOS component 1225 be a software component that includes BIOS operated as firmware, which may initialize and run various hardware components. BIOS component 1225 may also manage data flow between a processor and various other components, e.g., peripheral components, input/output control component, etc. BIOS component 1225 may include a program or software stored in read only memory (ROM), flash memory, or any other non-volatile memory.

Processor 1230 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1230 may be configured to operate a memory array using a memory controller. In other cases, a memory controller may be integrated into processor 1230. Processor 1230 may be configured to execute computer-readable instructions stored in a memory to perform various functions (e.g., functions or tasks supporting time-based access of a memory cell).

I/O controller 1235 may manage input and output signals for device 1205. I/O controller 1235 may also manage peripherals not integrated into device 1205. In some cases, I/O controller 1235 may represent a physical connection or port to an external peripheral. In some cases, I/O controller 1235 may utilize an operating system such as iOS®, ANDROID®, MS-DOS®, MS-WINDOWS®, OS/2®, UNIX®, LINUX®, or another known operating system. In other cases, I/O controller 1235 may represent or interact with a modem, a keyboard, a mouse, a touchscreen, or a similar device. In some cases, I/O controller 1235 may be implemented as part of a processor. In some cases, a user may interact with device 1205 via I/O controller 1235 or via hardware components controlled by I/O controller 1235.

Peripheral components 1240 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Figure 13:
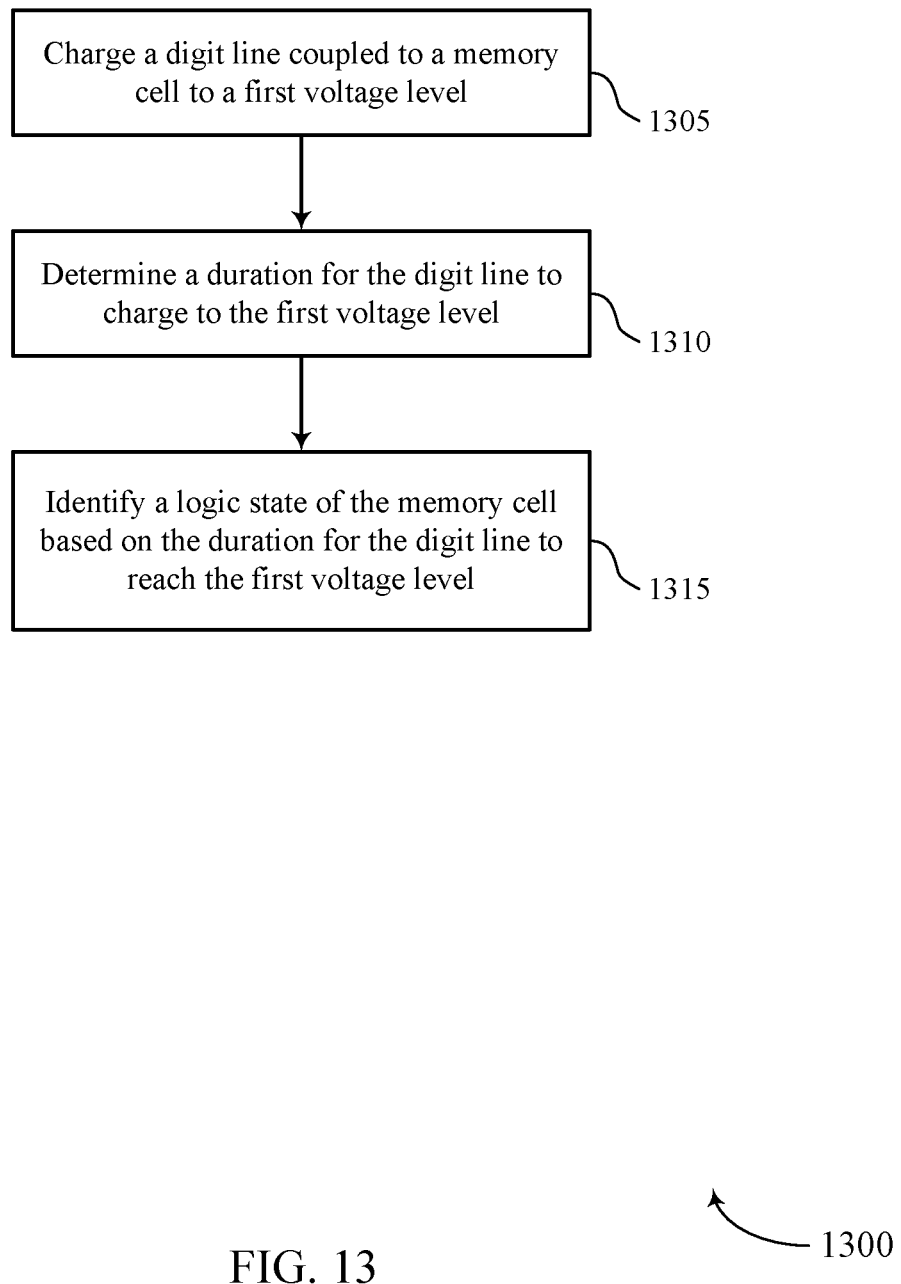
FIGS. 13 through 14 illustrate methods for time-based access of a memory cell in accordance with embodiments of the present disclosure.

FIG. 13 shows a flowchart illustrating a method 1300 for time-based access of a memory cell in accordance with various embodiments of the present disclosure. The operations of method 1300 may be implemented by a memory controller 1015 or its components as described herein. For example, the operations of method 1300 may be performed by a memory controller as described with reference to FIGS. 10 through 12. In some examples, a memory controller 1015 may execute a set of codes to control the functional elements of the device to perform the functions described below. Additionally or alternatively, the memory controller 1015 may perform portions of the functions described below using special-purpose hardware.

At block 1305 the memory controller 1015 may charge a digit line coupled to a memory cell to a first voltage level. The operations of block 1305 may be performed according to the methods described with reference to FIGS. 1 through 9. In certain examples, portions of the operations of block 1305 may be performed by a charging component as described with reference to FIGS. 10 through 12.

At block 1310 the memory controller 1015 may determine a duration for the digit line to charge to the first voltage level. The operations of block 1310 may be performed according to the methods described with reference to FIGS. 1 through 9. In certain examples, portions of the operations of block 1310 may be performed by a sensing manager as described with reference to FIGS. 10 through 12.

At block 1315 the memory controller 1015 may identify a logic state of the memory cell based at least in part on the duration for the digit line to reach the first voltage level. The operations of block 1315 may be performed according to the methods described with reference to FIGS. 1 through 9. In certain examples, portions of the operations of block 1315 may be performed by a logic determiner as described with reference to FIGS. 10 through 12.

In some cases, the memory cell is configured to store two logic states. In some cases, the duration is determined based at least in part on an amount of time that elapses between initiating a timer and the digit line charging to the first voltage level. In some cases, the voltage threshold is less than a biasing voltage used to generate a stable state of the memory cell. In some cases, the first voltage level to which the digit line is charged is a predetermined voltage level based at least in part on at least on one of a plurality of possible charge states of the memory cell. In some cases, the digit line is charged by a cascode coupled to the digit line and to a sense component. In some cases, the duration is based at least in part on a stable state of a capacitor of the memory cell and a volatile state of the capacitor of the memory cell. In some cases, the memory cell includes a ferroelectric capacitor. In some cases, the memory cell includes a dielectric capacitor. In some cases, the memory cell is configured to store at least three logic states.

Figure 14:
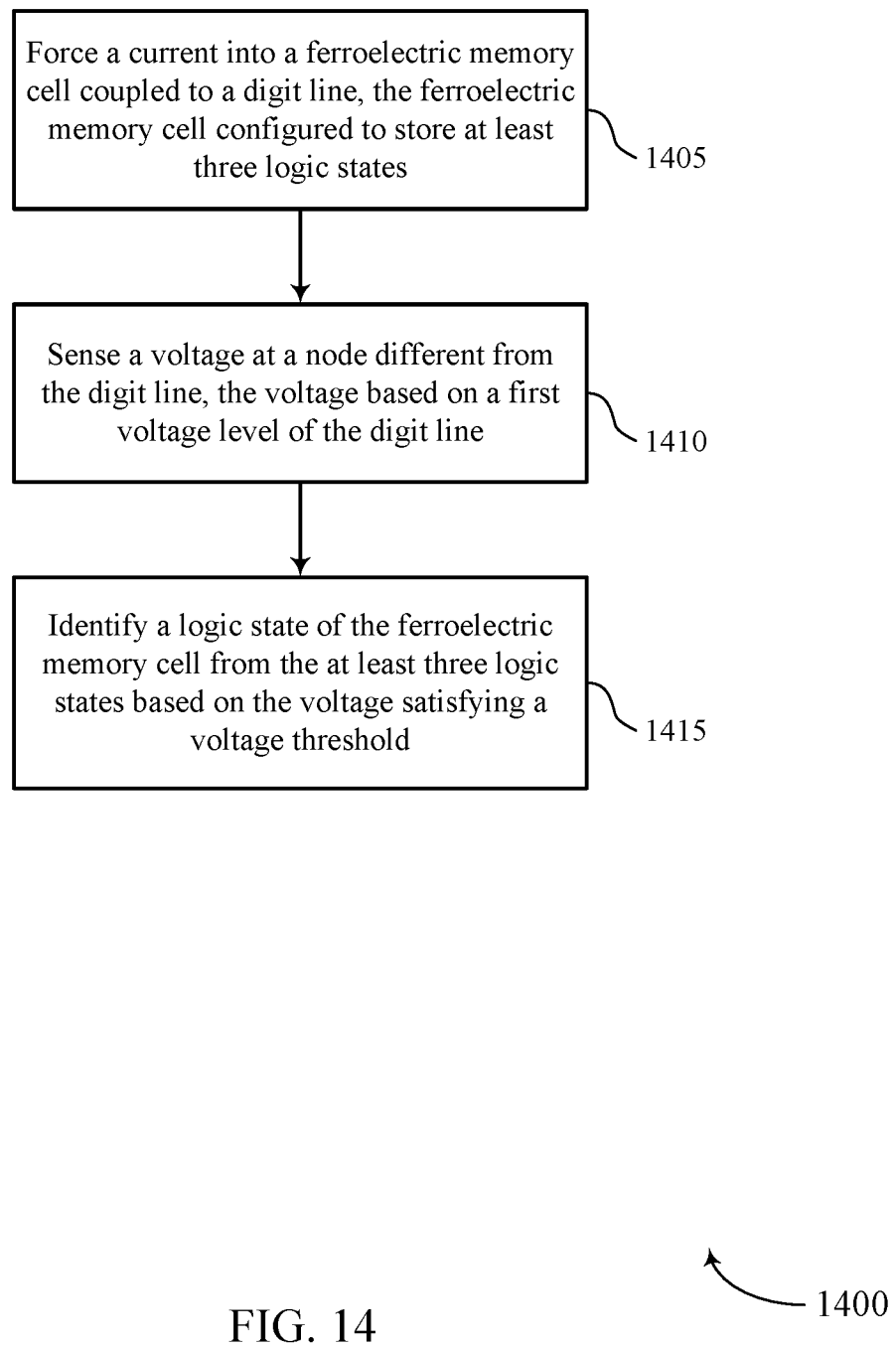

FIG. 14 shows a flowchart illustrating a method 1400 for time-based access of a memory cell in accordance with various embodiments of the present disclosure. The operations of method 1400 may be implemented by a memory controller 1015 or its components as described herein. For example, the operations of method 1400 may be performed by a memory controller as described with reference to FIGS. 10 through 12. In some examples, a memory controller 1015 may execute a set of codes to control the functional elements of the device to perform the functions described below. Additionally or alternatively, the memory controller 1015 may perform portions of the functions described below using special-purpose hardware.

At block 1405 the memory controller 1015 may force a current into a ferroelectric memory cell coupled to a digit line, the ferroelectric memory cell configured to store at least three logic states. The operations of block 1405 may be performed according to the methods described with reference to FIGS. 1 through 9. In certain examples, portions of the operations of block 1405 may be performed by a charging component as described with reference to FIGS. 10 through 12.

At block 1410 the memory controller 1015 may sense a voltage at a node different from the digit line, the voltage based at least in part on a first voltage level of the digit line. The operations of block 1410 may be performed according to the methods described with reference to FIGS. 1 through 9. In certain examples, portions of the operations of block 1410 may be performed by a sensing manager as described with reference to FIGS. 10 through 12.

At block 1415 the memory controller 1015 may identify a logic state of the ferroelectric memory cell from the at least three logic states based at least in part on the voltage satisfying a voltage threshold. The operations of block 1415 may be performed according to the methods described with reference to FIGS. 1 through 9. In certain examples, portions of the operations of block 1415 may be performed by a logic determiner as described with reference to FIGS. 10 through 12.

In some cases, the memory controller 1015 may identify a duration for a second voltage level present on the node to satisfy the voltage threshold, where the logic state is identified based at least in part on the duration. In some cases, the current is forced by a current generator coupled to the digit line and the node. In some cases, the duration is based at least in part on a total charge stored on a ferroelectric capacitor of the ferroelectric memory cell. In some cases, the total charge comprises a volatile charge of the ferroelectric capacitor and a stable charge of the ferroelectric capacitor. In some cases, the current is forced based at least in part on performing a read operation on the ferroelectric memory cell.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured to and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a memory cell in electronic communication with a digit line;
   a charging component having a first node coupled with the digit line and a second node;
   a sense component coupled with the second node of the charging component, the sense component configured to output a signal based at least in part on a relationship between a first voltage at the first node a second voltage at the second node; and
   a latch coupled with the sense component, the latch configured to receive the signal from the sense component indicating that the second voltage at the second node satisfies a voltage threshold.

2. The apparatus of claim 1, wherein the sense component is further configured to output the signal based at least in part on the second voltage at the second node satisfying the voltage threshold, the voltage threshold based at least in part on the relationship between the first voltage and the second voltage.

3. The apparatus of claim 1, further comprising:
   a controller coupled with the sense component, the controller operable to identify a logic state of the memory cell based at least in part on whether a duration of a read operation satisfies a time threshold for the read operation.

4. The apparatus of claim 3, wherein the duration of the read operation corresponds to an amount of time between the charging component applying a current to the digit line and the sense component outputting the signal.

5. The apparatus of claim 3, wherein identifying the logic state of the memory cell is based at least in part on the charging component charging the digit line to a predetermined voltage.

6. The apparatus of claim 1, wherein the latch is configured to output a value of a time-varying signal based at least in part on receiving the signal from the sense component.

7. The apparatus of claim 6, further comprising:
   a controller coupled with the output of the latch, the controller operable to identify a logic state of the memory cell based at least in part on the value of the time-varying signal received from the latch.

8. The apparatus of claim 1, further comprising:
   at least two latches coupled with the sense component, the at least two latches configured to receive the signal from the sense component indicating that the second voltage at the second node satisfies the voltage threshold, wherein the at least two latches comprises the latch.

9. The apparatus of claim 8, wherein the at least two latches are configured to output a value of a first time-varying signal and a value of a second time-varying signal based at least in part on receiving the signal from the sense component.

10. The apparatus of claim 9, further comprising:
    a controller coupled with the output of the at least two latches, the controller operable to identify a logic state of the memory cell based at least in part on the value of the first time-varying signal and the value of the second time-varying signal received from the at least two latches.

11. An apparatus comprising:
    a ferroelectric memory cell coupled with a digit line and configured to store at least three logic states; and
    a controller coupled with the ferroelectric memory cell, wherein the controller is operable to:
        apply a current to the ferroelectric memory cell coupled to the digit line;
        sense that a first voltage at a node different from the digit line satisfies a voltage threshold, the first voltage based at least in part on a second voltage at the digit line;
        output, by a latch, a value of a time-varying signal based at least in part on the first voltage at the node satisfying the voltage threshold; and
        identify a logic state of the ferroelectric memory cell from the at least three logic states based at least in part on a relationship between the first voltage at the node and the second voltage at the digit line the value of the time-varying signal output by the latch.

12. The apparatus of claim 11, wherein the controller is further operable to:
    identifying that the first voltage satisfies the voltage threshold, wherein the voltage threshold is based at least in part on a relationship between the first voltage and the second voltage.

13. The apparatus of claim 11, wherein the controller is further operable to:
    identify a duration for a third voltage present on the node that satisfies a second voltage threshold, wherein the second voltage threshold is based at least in part on a relationship between the first voltage and the second voltage and the logic state is identified based at least in part on the duration.

14. The apparatus of claim 13, wherein:

the duration is based at least in part on a total charge stored on a ferroelectric capacitor of the ferroelectric memory cell.

15. The apparatus of claim 14, wherein:

the total charge comprises a volatile charge of the ferroelectric capacitor and a stable charge of the ferroelectric capacitor.

16. The apparatus of claim 11, wherein:

identifying the logic state of the ferroelectric memory cell is based at least in part on a polarization state of a ferroelectric capacitor of the ferroelectric memory cell and a charge state of the ferroelectric capacitor of the ferroelectric memory cell.

17. A method, comprising:

applying a current to memory cell coupled with a digit line;

sensing that a first voltage at a node different from the digit line satisfies a voltage threshold based at least in part on applying the current to the memory cell;

outputting, by a latch, a value of a time-varying signal based at least in part on the first voltage at the node satisfying the voltage threshold; and identifying a logic state of the memory cell based at least in part on a relationship between the first voltage at the node and the second voltage at the digit line the value of the time-varying signal output by the latch.

18. The method of claim 17, further comprising:

identifying that the first voltage satisfies the voltage threshold, wherein the voltage threshold is based at least in part on a relationship between the first voltage and a second voltage and identifying the logic state of the memory cell is based at least in part on identifying that the first voltage satisfies the voltage threshold.

19. The method of claim 17, wherein:

the memory cell is configured to store at least three logic states; and identifying the logic state of the memory cell comprises identifying the logic state of the memory cell from the at least three logic states.

\* \* \* \* \*